US009673241B2

(12) United States Patent
Nishiwaki et al.

(10) Patent No.: US 9,673,241 B2
(45) Date of Patent: Jun. 6, 2017

(54) LIGHT-CONDENSING UNIT, SOLID-STATE IMAGE SENSOR, AND IMAGE CAPTURE DEVICE

(71) Applicant: Panasonic Corporation, Osaka (JP)

(72) Inventors: Seiji Nishiwaki, Hyogo (JP); Tatsuya Nakamura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 371 days.

(21) Appl. No.: 14/334,771

(22) Filed: Jul. 18, 2014

(65) Prior Publication Data

US 2014/0327783 A1 Nov. 6, 2014

Related U.S. Application Data

(63) Continuation of application No. PCT/JP2013/006929, filed on Nov. 26, 2013.

(30) Foreign Application Priority Data

Nov. 30, 2012 (JP) .................................. 2012-262739

(51) Int. Cl.
H04N 5/225 (2006.01)
H01L 27/146 (2006.01)
(Continued)

(52) U.S. Cl.
CPC .. *H01L 27/14625* (2013.01); *H01L 27/14621* (2013.01); *H01L 27/14627* (2013.01);
(Continued)

(58) Field of Classification Search
None
See application file for complete search history.

(56) References Cited

U.S. PATENT DOCUMENTS

2006/0266928 A1 11/2006 Takiba et al.
2009/0278048 A1 11/2009 Choe et al.
(Continued)

FOREIGN PATENT DOCUMENTS

JO 2012-049620 A 3/2012
JP 11-289491 10/1999
(Continued)

OTHER PUBLICATIONS

International Search Report for corresponding International Application No. PCT/JP2013/006929 mailed Jan. 21, 2014.
(Continued)

*Primary Examiner* — Mohammed Rahaman
(74) *Attorney, Agent, or Firm* — Renner, Otto, Boisselle & Sklar, LLP

(57) ABSTRACT

A solid-state image sensor according to an embodiment of the present disclosure includes a photodetector array 100 in which photodetectors A and B are arranged two-dimensionally within an image capturing plane. Some of those photodetectors B located in multiple different mutually intersecting directions with respect to each photodetector A are adjacent to the photodetector A. The sensor further includes a light-splitting element array 200 in which a plurality of light-splitting elements 30, each including a phase filter 3, are arranged two-dimensionally and which is configured so that each of the light-splitting elements 30 faces an associated one of the photodetectors A. The phase filter 3 makes light falling within a first wavelength range incident on the photodetector A that the phase filter 3 faces, and makes light falling within a second wavelength range incident on the photodetectors B that are adjacent to the photodetector A.

13 Claims, 26 Drawing Sheets

(51) Int. Cl.
*H04N 5/33* (2006.01)
*H04N 5/335* (2011.01)
*H04N 9/04* (2006.01)

(52) U.S. Cl.
CPC .. *H01L 27/14645* (2013.01); *H01L 27/14649* (2013.01); *H04N 5/33* (2013.01); *H04N 5/335* (2013.01); *H04N 9/045* (2013.01)

(56) References Cited

U.S. PATENT DOCUMENTS

| | | |
|---|---|---|
| 2010/0176473 A1 | 7/2010 | Nishiwaki |
| 2010/0188537 A1 | 7/2010 | Hiramoto et al. |
| 2010/0200730 A1* | 8/2010 | Yukawa ............ H01L 27/14621 250/208.1 |
| 2011/0192962 A1 | 8/2011 | Nishiwaki et al. |
| 2011/0285956 A1 | 11/2011 | Akao et al. |
| 2012/0182453 A1 | 7/2012 | Hiramoto et al. |
| 2012/0206637 A1 | 8/2012 | Hiramoto et al. |
| 2012/0212656 A1* | 8/2012 | Hiramoto .......... H01L 27/14621 348/294 |
| 2013/0099343 A1 | 4/2013 | Toshikiyo et al. |

FOREIGN PATENT DOCUMENTS

| | | |
|---|---|---|
| JP | 2001-189926 A | 7/2001 |
| JP | 2007-088265 A | 4/2007 |
| JP | 2009-272620 A | 11/2009 |
| JP | 2009-290268 A | 12/2009 |
| JP | 2010-008092 A | 1/2010 |
| JP | 2010-178133 A | 8/2010 |
| JP | 2012-049619 A | 3/2012 |
| WO | WO 2009/019818 A1 | 2/2009 |
| WO | WO 2009/153937 A1 | 12/2009 |
| WO | WO 2010/016195 A1 | 2/2010 |
| WO | WO 2012/001930 A1 | 1/2012 |

OTHER PUBLICATIONS

Form PCT/ISA/237 for corresponding International Application No. PCT/JP2013/006929 dated Jan. 21, 2014 and partial English Translation.

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

LIGHT-CONDENSING UNIT, SOLID-STATE IMAGE SENSOR, AND IMAGE CAPTURE DEVICE

This is a continuation of International Application No. PCT/JP2013/006929, with an international filing date of Nov. 26, 2013, which claims priority of Japanese Patent Application No. 2012-262739, filed on Nov. 30, 2012, the contents of which are hereby incorporated by reference.

BACKGROUND

1. Technical Field

The present disclosure relates to a light-condensing unit, a solid-state image sensor, and an image capture device including the solid-state image sensor.

2. Description of the Related Art

A solid-state image sensor is made by forming a huge number of photodetectors in a silicon (Si) substrate. The solid-state image sensor generates an electrical signal representing the quantity of light that has been incident on each of those photodetectors by photoelectric conversion. The photodetectors are typically photodiodes formed in the silicon substrate. The light that has been incident on each photodetector is absorbed into silicon to generate electron-hole pairs.

FIG. 30 is a graph showing how the ratio of the light that has been incident perpendicularly onto the surface of silicon and then absorbed into a region to a depth of 4 μm under the surface of silicon (i.e., the absorbed fraction) changes with the wavelength of the incident light. In this graph, the abscissa represents the wavelength of the incident light and the ordinate represents the absorbed fraction. As can be seen from FIG. 30, light with the color blue wavelength (of 400 to 500 nm) is absorbed almost 100% into that region to the depth of 4 μm under the surface. However, the longer the wavelength of the incident light, the lower the absorbed fraction. And only 10 to 20% of near-infrared light (with a wavelength of 800 to 900 nm) is absorbed. That is to say, an infrared ray (which will be referred to herein as "infrared light") is hardly absorbed into the surface region of silicon but is transmitted to reach a region deep under the surface.

In this description, the visible light wavelength range is defined to be from 400 nm to 700 nm, and the infrared light wavelength range is defined to be from 700 nm to 2.5 μm. Also, the infrared light will be sometimes abbreviated herein as "IR light".

A conventional solid-state image sensor that uses such a property is disclosed in Japanese Laid-Open Patent Publication No. 2009-272620. The solid-state image sensor disclosed in Japanese Laid-Open Patent Publication No. 2009-272620 includes a lot of photodetectors (visible light detectors) which are arranged two-dimensionally on an image capturing plane and infrared light detectors which are arranged deeper than the visible light detectors with respect to the image capturing plane. These photodetectors are implemented as respectively independent photodiodes and generate electrical signals representing the quantities of light absorbed by photoelectric conversion.

The infrared light that has been incident on the image capturing plane of this solid-state image sensor is not absorbed into the visible light detectors but reaches the infrared light detectors which are located deeper than the visible light detectors. Meanwhile, most of the visible light is absorbed into the visible light detectors and does not reach the infrared light detectors. With such a solid-state image sensor, the photosensitive area of the infrared light detectors can be set to be sufficiently broad without being constrained by the photosensitive area of the visible light detectors.

SUMMARY

The solid-state image sensor described above uses the absorption property of silicon to separate visible light and infrared light from each other, and therefore, the thicknesses of those visible light detectors and those infrared light detectors cannot be set arbitrarily and independently of each other. That is why the balance between the quantity of the visible light and that of the infrared light cannot be changed independently of each other. Consequently, the degree of freedom of design is low as far as color adjustment is concerned, and therefore, the sensitivity of a particular color will get saturated easily and various other problems are likely to arise. In addition, since those photodetectors for visible light and for infrared light are stacked one upon the other, the structure of the element gets overly complicated and the manufacturing cost rises, too.

One non-limiting, and exemplary embodiment provides a technique to increase the sensitivity of infrared light detectors without stacking those visible light detectors and infrared light detectors one upon the other.

In one general aspect, a solid-state image sensor according to an embodiment of the present disclosure includes: a photodetector array in which a plurality of photodetectors of a first type and a plurality of photodetectors of a second type are arranged two-dimensionally within an image capturing plane so that some of those photodetectors of the second type which are located in multiple different mutually intersecting directions with respect to each photodetector of the first type are adjacent to the photodetector of the first type; and a light-splitting element array in which a plurality of light-splitting elements, each including a phase filter, are arranged two-dimensionally and which is configured so that each of the plurality of light-splitting elements faces an associated one of the photodetectors of the first type. The phase filter of each light-splitting element is configured to make light falling within a first wavelength range incident on the first type of photodetector that the phase filter faces and make light falling within a second wavelength range incident on the second type of photodetectors that are adjacent to the first type of photodetector.

A solid-state image sensor according to another embodiment of the present disclosure includes: a photodetector array in which a plurality of photodetectors of a first type and a plurality of photodetectors of a second type are alternately arranged in a first direction within an image capturing plane; and a light-splitting element array in which a plurality of light-splitting elements, each including a phase filter, are arranged two-dimensionally and which is configured so that the plurality of light-splitting elements face the plurality of photodetectors of the first type. The phase filter of each light-splitting element is offset in a second direction that intersects with the first direction at right angles with respect to the first type of photodetector that the phase filter faces when viewed along a normal to the image capturing plane and is configured to make light falling within a first wavelength range incident on the first type of photodetector that the phase filter faces and make light falling within a second wavelength range incident on the two photodetectors of the second type that are adjacent to the first type of photodetector.

In one general aspect, a light-condensing unit according to another embodiment of the present disclosure includes: a condensing element; and a phase shift element which is arranged close to, and coaxially with, the condensing element and which shifts the phase of light being transmitted. The condensing element has a square aperture, and splits light with a particular wavelength so that the intensity distribution of the light with the particular wavelength at a position corresponding to a Fourier imaging plane of the condensing element has four peaks.

According to the above aspect, it is possible to detect visible light and infrared light independently of each other. Also, infrared light that would be incident on a visible light detector without the light-splitting element array can be made to be incident on an infrared light detector through the light-splitting element array. As a result, the sensitivity to infrared light can be increased.

These general and specific aspects may be implemented using a system, a method, and a computer program, and any combination of systems, methods, and computer programs.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

Hereinafter, a basic configuration for a solid-state image sensor according to an embodiment of the present disclosure will be described with reference to FIGS. 1 through 5B.

Figure 1:
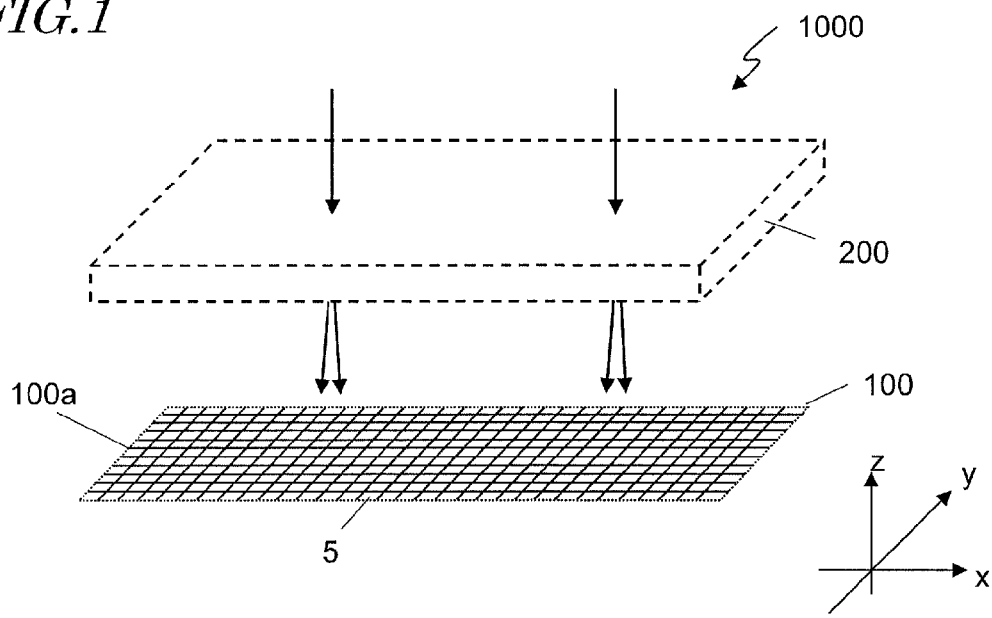
FIG. 1 is a perspective view schematically illustrating a basic configuration for a solid-state image sensor 1000 according to the present disclosure.

FIG. 1 schematically illustrates a basic configuration for a solid-state image sensor 1000 according to the present disclosure. The solid-state image sensor 1000 includes a photodetector array 100 in which a huge number of photodetectors 5 are arranged two-dimensionally within an image capturing plane 100a and a light-splitting element array 200 which is arranged so as to face the photodetector array 100. The horizontal and vertical directions on the image capturing plane 100a of the photodetector array 100 will be referred to herein as "X axis" and "Y axis", respectively, and the direction that intersects with the image capturing plane at right angles will be referred to herein as "Z axis". In this description, to spatially split incoming light into multiple components of light falling within mutually different wavelength ranges or having respectively different color components will be referred to herein as "splitting of light". Also, the minimum spatial unit for sensing light will be sometimes referred to herein as a "photosensing cell" or a "pixel region".

The light that has come from a subject that is located over the upper part of the paper on which FIG. 1 is drawn is incident on the light-splitting element array 200 through a shooting lens (not shown) and then reaches the photodetector array 100, which is the photosensing section of a solid-state image sensor such as a CCD (charge-coupled device) or CMOS (complementary metal-oxide-semiconductor) image sensor. Each photodetector 5 is typically a photoelectric transducer such as a photodiode which has been formed in a single crystalline silicon chip. However, the semiconductor in which the photodetector 5 is formed does not have to be silicon but may also be any other inorganic or organic semiconductor as well. According to embodiments of the present disclosure, the structure itself of the photodetector array 100 is not particularly limited, but any of various kinds of structures may be used.

Figure 2:
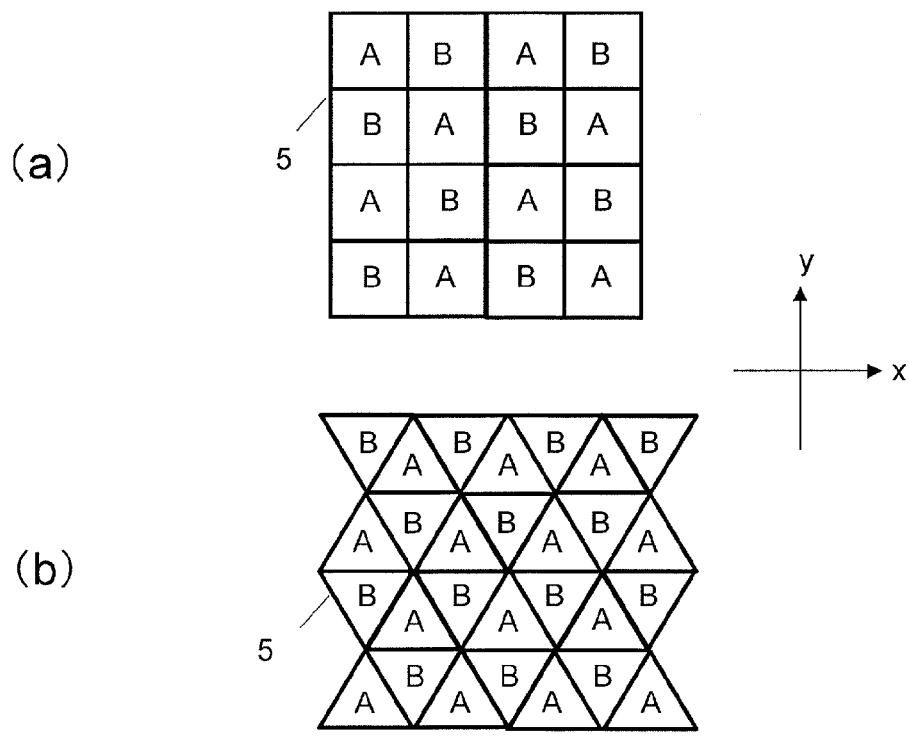
FIG. 2 shows examples of a photodetector array according to the present disclosure, wherein (a) is a plan view illustrating an exemplary arrangement pattern of first and second types of photodetectors A and B according to an embodiment of the present disclosure. (b) is a plan view illustrating another exemplary arrangement pattern of first and second types of photodetectors A and B.

As described above, the photodetector array 100 of the present disclosure includes a lot of photodetectors 5 which are arranged two-dimensionally within the image capturing plane 100a. These photodetectors 5 include a plurality of photodetectors A of a first type and a plurality of photodetectors B of a second type which may be arranged as shown in FIG. 2, for example. These first and second types of photodetectors A and B receive light beams falling within mutually different wavelength ranges and convert the light beams into electrical signals. According to the present disclosure, the arrangement of the first and second types of photodetectors A and B has some regularity. In one embodiment, when attention is paid to a single photodetector A of the first type which has been chosen arbitrarily from the photodetector array 100, the photodetectors B of the second type which are located in multiple different mutually intersecting directions with respect to the first type of photodetector A are adjacent to that photodetector A of the first type. Hereinafter, this point will be described in further detail with reference to FIG. 2. It should be noted that the arrangement patterns of the photodetectors 5 are not limited to the examples illustrated in portions (a) and (b) of FIG. 2.

First, look at portion (a) of FIG. 2. In the example illustrated in portion (a) of FIG. 2, four photodetectors B of the second type which are located in two mutually orthogonal directions (i.e., X- and Y-axis directions) with respect to each photodetector A of the first type are adjacent to that photodetector A of the first type. In other words, the first and second types of photodetectors A and B are alternately arranged in columns and rows to form a checkerboard pattern.

The square cells illustrated in portion (a) of FIG. 2 represent pixel regions in which respective photodetectors 5 are provided. Each of those photodetectors 5 includes at least one photoelectric transducer and may include a switching transistor and other additional elements. The photoelectric transducer is typically a photodiode. The photodetector array 100 is the photosensing section of the image sensor which may be a CMOS or CCD image sensor, for example, and may be fabricated by known semiconductor device processing technologies. The photodetector array 100 actually includes lines to connect the respective photodetectors to a read circuit (not shown), but those lines are not illustrated in FIG. 2 for the sake of simplicity.

The two directions that intersect with each other at right angles (i.e., 90 degrees) in the example shown in portion (a) of FIG. 2 may intersect with each other at any other angles. Also, the rows and columns of the photodetectors 5 may define tilt angles with respect to the horizontal and vertical directions within the image capturing plane.

Next, look at portion (b) of FIG. 2. In the example illustrated in portion (b) of FIG. 2, when attention is paid to a single photodetector A of the first type, three photodetectors B of the second type which are located in three different directions that intersect with each other at 120 degrees with respect to the first type of photodetector A are adjacent to that photodetector A of the first type. In other words, in the example illustrated in portion (b) of FIG. 2, a plurality of hexagonal base units, each consisting of six photodetectors 5, are arranged densely within the image capturing plane. In each of those base units, the first and second types of photodetectors A and B are arranged alternately around the center of the hexagon. The three directions which intersect with each other at 120 degrees in this example may also intersect with each other at any other angle, too.

In one embodiment, each of the photodetectors A of the first type shown in portions (a) and (b) of FIG. 2 functions as a visible light detector. Over the photodetector A of the first type, a color filter, of which the light transmission property varies according to the position of the photodetector A of the first type, may be arranged. For example, if a G filter which transmits a green (G) ray covers some photodetector A of the first type, that photodetector A of the first type functions as a G light detector and generates an electrical signal representing the quantity of the G ray. The same can be said about the other colors. If a full-color image needs to be obtained with the first type of photodetectors A, then the first type of photodetectors A are covered with a plurality of color filters which are arranged in a mosaic pattern so as to transmit light beams representing the three primary colors such as red (R), green (G) and blue (B). Meanwhile, in a solid-state image sensor to capture a monochrome image, those color filters do not have to cover the respective photodetectors A of the first type, but the photodetectors B of the second type typically function as infrared light detectors. In that case, unlike the element disclosed in Japanese Laid-Open Patent Publication No. 2009-272620 mentioned above, the infrared detectors of the present disclosure are not arranged under the visible light detectors. It should be noted that in this description, the "infrared light detector" does not have to have the ability to detect every light beam (or electromagnetic wave) having any wavelength that falls within the broad infrared range but the wavelength of the light beam that can be detected just needs to fall within the infrared range. That is why a photodetector which can detect only a light beam having a wavelength of around 850 nm is also called an "infrared light detector" in this description.

As described above, the image capturing plane 100a in which the first and second types of photodetectors A and B are arranged regularly faces the light-splitting element array 200. The light-splitting element array 200 includes a plurality of light-splitting elements, each of which faces an associated one of the photodetectors A of the first type. Hereinafter, an exemplary configuration for the light-splitting element array 200 will be described.

Figure 3:
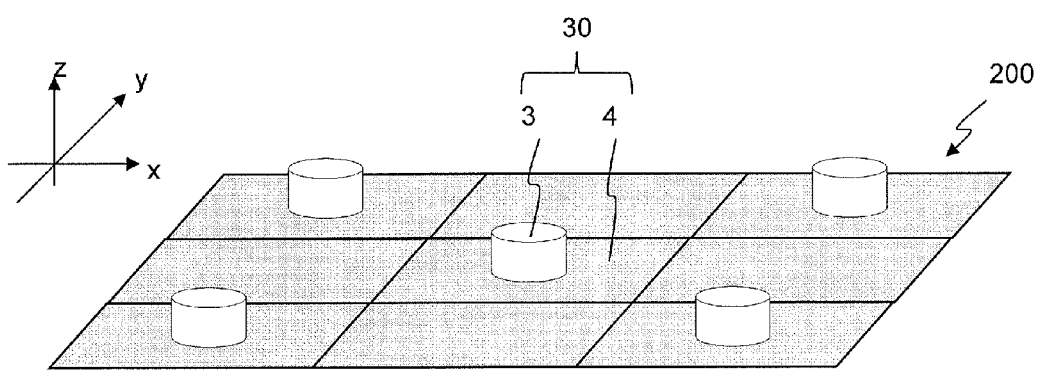
FIG. 3 is a perspective view schematically illustrating an exemplary configuration for a light-splitting element array 200 which may be used in an embodiment of the present disclosure.
Figure 3:
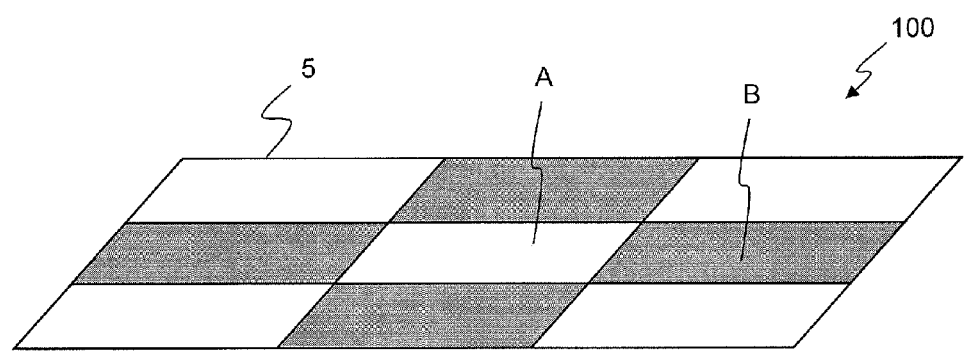

FIG. 3 is a perspective view schematically illustrating an exemplary light-splitting element array 200 which may be used in an embodiment of the present disclosure. In FIG. 3, illustrated is only a portion of the light-splitting element array 200 including five light-splitting elements 30. These five light-splitting elements 30 respectively face five photodetectors A of the first type in the image capturing plane 100a.

In the example illustrated in FIG. 3, each light-splitting element 30 includes a circular cylindrical phase filter 3 and a micro lens 4, of which the lens aperture has a square planar shape. The micro lens 4 actually has a thickness in the Z-axis direction, which varies within the XY plane to form a lens surface. In FIG. 3, however, the micro lens 4 is illustrated as having no thickness in the Z-axis direction for the sake of simplicity. The micro lenses 4 are not essential elements for an embodiment of the present disclosure but have the function of shortening the distance from the photodetector array 100 to the light-splitting element array 200. In this example, the micro lenses 4 function as condensing elements. Also, the phase filters 3 are arranged close to, and coaxially with, those condensing elements and function as phase shift elements to shift the phase of light being transmitted.

Each of those phase filters 3 is configured to make a light beam falling within a first wavelength range incident by "condensing interference" on the first type of photodetector A that the phase filter 3 faces and also make a light beam falling within a second wavelength range incident on the second type of photodetectors B which are adjacent to the first type of photodetector A. That is to say, if the photodetectors 5 have the arrangement pattern shown in portion (a) of FIG. 2, each phase filter 3 makes a light beam falling within the first wavelength range incident on the first type of photodetector A that the phase filter 3 faces, and also makes a light beam falling within the second wavelength range incident on four photodetectors B of the second type which are located in two mutually orthogonal directions with respect to each photodetector A of the first type. On the other hand, if the photodetectors 5 have the arrangement pattern shown in portion (b) of FIG. 2, each phase filter 3 makes a light beam falling within the first wavelength range incident on the first type of photodetector A that the phase filter 3 faces, and also makes a light beam falling within the second wavelength range incident on three photodetectors B of the second type which are located in three directions that intersect with each other at an angle of 120 degrees with respect to each photodetector A of the first type.

In this case, the "first wavelength range" is typically a part or all of the visible radiation range and the "second wavelength range" is typically a part or all of the infrared range. Also, the first and second wavelength ranges may partially overlap with each other and do not have to be perfectly separated from each other.

Hereinafter, it will be described with reference to FIG. 4 why light is split by "condensing interference".

Figure 4:
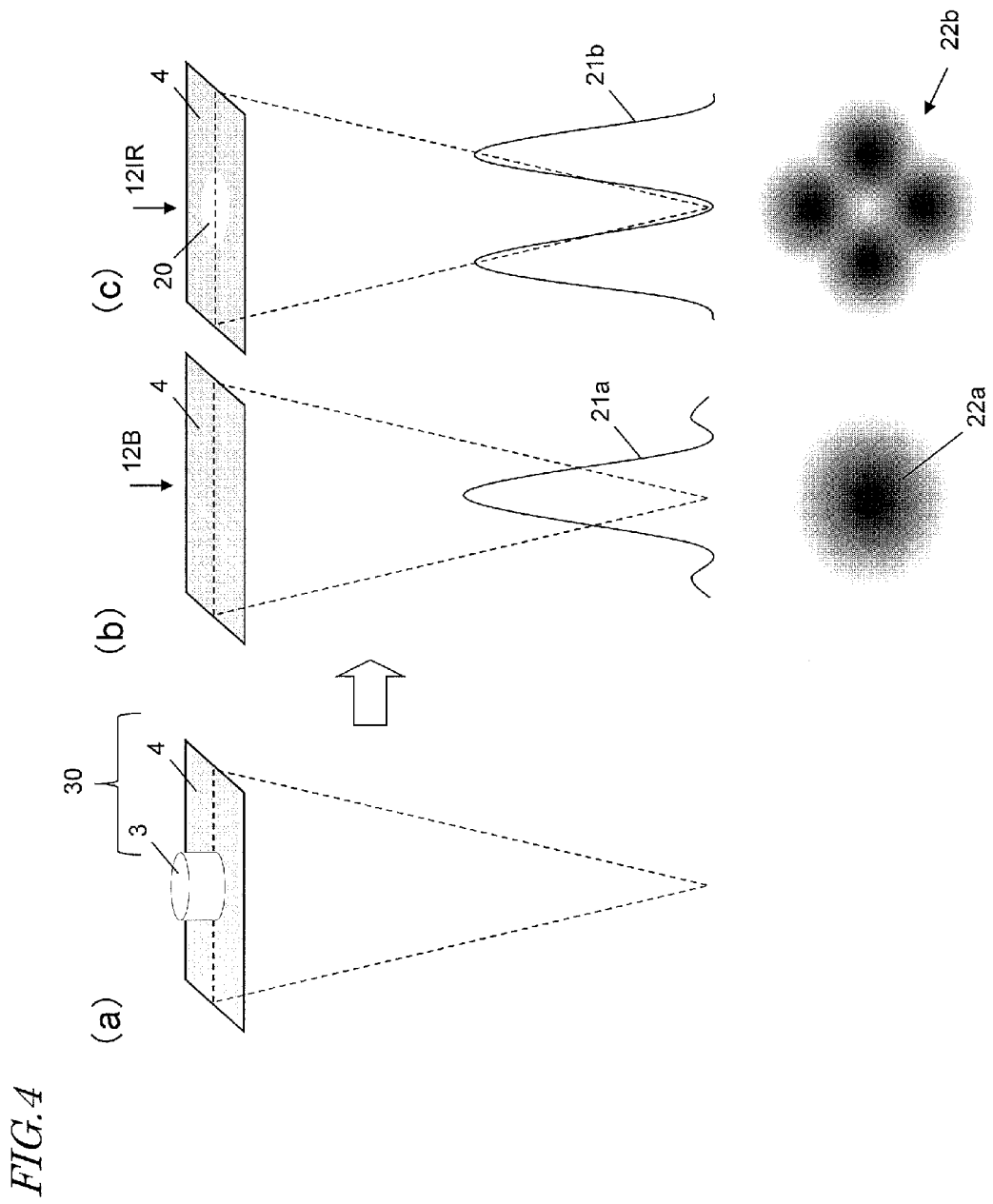
FIG. 4 shows how an exemplary light-condensing unit works according to the present disclosure, wherein (a) is a perspective view illustrating a configuration in which a circular cylindrical phase filter 3 is arranged in front of a micro lens 4, of which the aperture has a square planar shape. (b) is a perspective view illustrating how when a light beam 12B with a color blue wavelength is incident, a single condensed beam spot 21a (with an in-plane distribution 22a) is formed. And (c) is a perspective view illustrating how when a light beam 12IR with an infrared wavelength is incident, a plurality of condensed beam spots 21b (with an in-plane distribution 22b) are formed.

Portion (a) of FIG. 4 is a perspective view illustrating a general configuration for a light-splitting element 30 which is arranged so as to face a blue light detector 5B. Its phase filter 3 is made of a material, of which the refractive index is higher than that of its surrounding member, and has a refractive index difference from the surrounding member. Due to such a refractive index difference, a phase difference is created in the light propagating inside and outside of the phase filter 3. The height of the phase filter 3 is set so as to create a $2\pi$ phase difference (more exactly, $2\pi \times$integer) when the phase filter 3 transmits a light beam having a color blue wavelength and to create a $\pi$ phase difference (more exactly, $\pi \times$half integer) when the phase filter 3 transmits a light beam having an infrared light wavelength. When incoming light including infrared light and visible light is transmitted through a light-splitting element 30 with such a configuration, an interference phenomenon of light arises to varying degrees according to the wavelength of the incoming light in a region where a Fourier transformed image of the phase filter 3 is produced. And as result of this interference, the distribution of light intensities within an XY plane which is parallel to the image capturing plane comes to have a particular pattern.

Hereinafter, it will be described what the difference in light-splitting principle between the high-refractive-index transparent portion disclosed in PCT International Application Publication No. 2009/019818 (which will be referred to herein as a "phase shifter") and the phase filter of the present disclosure is.

In the phase shifter, light propagating inside the phase shifter and light propagating through a low-refractive-index layer that surrounds the phase shifter interfere with each other, thus splitting the light that has just passed through the phase shifter as a result of this interference phenomenon.

In the phase filter of the present disclosure, on the other hand, most of light propagating inside the phase filter and most of light propagating through a low-refractive-index region surrounding the phase filter go straight on even after having passed through the phase filter. And in a region where a Fourier transformed image of this phase filter is produced, these light beams interfere with each other, thus splitting the light as a result of this interference phenomenon.

Taking these points into consideration, the difference in light-splitting principle between the phase shifter of the related art and the phase filter of the present disclosure should manifest itself as a difference in distance from the phase shifter or phase filter to the photodetector, to say the least. More specifically, in the phase filter of the present disclosure, the photodetector is arranged in the vicinity of the region where a Fourier transformed image of the phase filter is produced. If a micro lens is arranged before or after the phase filter, then the photodetector is arranged in the vicinity of the focal plane of the micro lens. Considering the position of the focal plane of a micro lens to be calculated based on the radius of curvature and refractive index of the micro lens normally used and its in-plane position, of which the effect was confirmed through an analysis to be described later, the photodetector is arranged in an embodiment of the present disclosure at a distance of at least 5 μm from the phase filter in order to separate the infrared light. In the phase shifter of the related art, on the other hand, the light is split on passing through the inside of the phase shifter, and therefore, the photodetector is arranged at a distance of approximately 1 to 2 μm from the phase shifter, for example.

As shown in portion (b) of FIG. 4, when a light beam 12B with a color blue wavelength is incident, a single condensed beam spot 21a (with an in-plane distribution 22a) is formed. On the other hand, when a light beam 12IR with an infrared wavelength is incident, a phase difference $\pi$ is created in the region 20 where there is the phase filter 3. As a result, a plurality of condensed beam spots 21b (with an in-plane distribution 22b) are formed as shown in portion (c) of FIG. 4. In the region 20 shown in portion (c) of FIG. 4, a phase level difference of $\pi$ is created responsive to the infrared light but a phase level difference of $2\pi$ is created responsive to the color blue light. It should be noted that the in-plane distribution 22b shown in portion (c) of FIG. 4 is the intensity distribution of light with a particular wavelength at a position corresponding to the Fourier imaging plane of the micro lens 4 functioning as a condensing element. In the example illustrated in portion (c) of FIG. 4, the light is split so that the condensing element and the phase shift element together function as a light-condensing unit and that the in-plane distribution 22b (i.e., the intensity distribution of the light with a particular wavelength) looks like a four-leaf clover. That is to say, the light is split so as to have respective peaks in the four quadrants of the Fourier imaging plane.

Major conditions for splitting infrared light into four condensed beam spots such as the ones shown in portion (c) of FIG. 4 include that the micro lens 4 should have a rectangular aperture area, that the viewing plane of the condensed beam spot is located in the vicinity of the focal plane of the micro lens 4, and that the center of the phase filter 4 agrees with (i.e., coaxial with) that of the aperture area.

To produce the condensing interference, the phase filter 3 does not have to have a circular planar shape but may also have a diamond shape or any other appropriate planar shape. However, to split infrared light into four condensed beam spots such as the ones shown in portion (c) of FIG. 4, the phase filter 3 suitably has a shape which is substantially symmetric in the four directions in which the light is to be split. Also, although the phase filter 3 and the micro lens 4 are supposed to be arranged in this order so that the phase filter 3 is located closer to the light source of the incoming light, the phase filter 3 and the micro lens 4 may also be arranged in reverse order. Furthermore, even if no micro lens 4 is provided (which means that the lens has a sufficiently long focal length), the same phenomenon will occur at a position which is distant from the aperture (i.e., at a position where a Fourier transformed image of the phase filter 3 is produced). Moreover, the aperture does not always have to have a square shape but may also have any other appropriate shape. It should be noted that if no micro lens 4 is provided, then a grid opaque layer will be formed so as to partition adjacent apertures from each other and the aperture shape may be defined as a result. The shape of the aperture has influence on the in-plane intensity distribution of the light to be produced through the condensing interference. For example, if the aperture has a circular shape, the in-plane distribution 22b shown in portion (c) of FIG. 4 becomes a ringlike one.

The sizes of the phase filter 3 within the XY plane may be set so that the ratio of the area occupied by the phase filter 3 to the area of each pixel region falls within the range of 0.2 to 0.8. For example, if a single pixel region has an area of 5 to 60 μm$^2$ and if a cross section of the phase filter 3 as viewed parallel to the XY plane has a circular profile, then the diameter of that cross section may be set to be approximately 1 to 4 μm. In that case, the pixel pitch (i.e., the interval between respective centers of adjacent photodetectors) may be set to fall within the range of approximately 2 to 8 μm (e.g., within the range of approximately 4 to 7 μm).

Figure 5A:
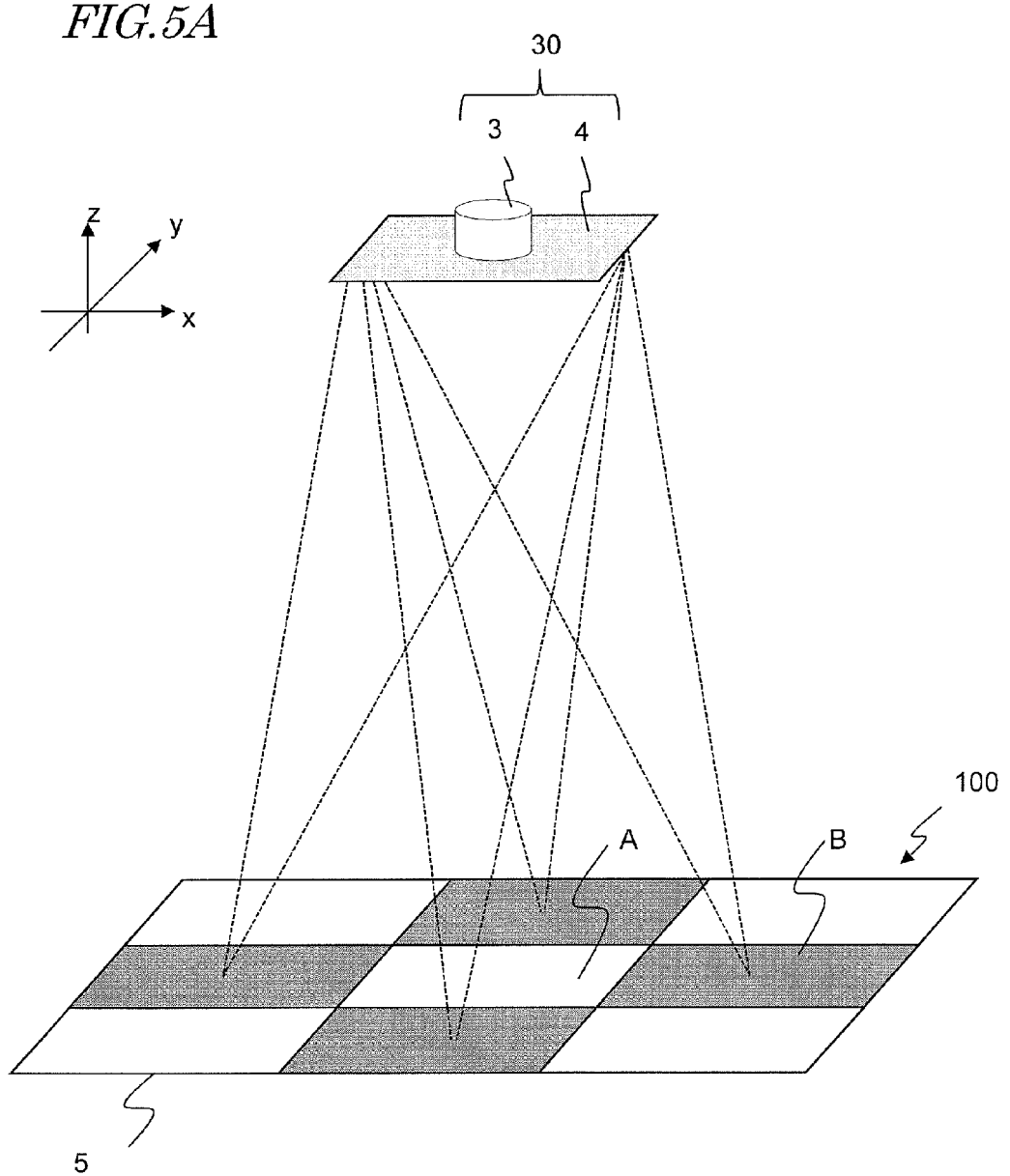
FIG. 5A schematically illustrates how a single light-splitting element 30 makes light beams falling within the second wavelength range (as indicated by the dotted lines) incident on four photodetectors B of the second type which are adjacent to the first type of photodetector A that the light-splitting element 30 faces.
Figure 5B:
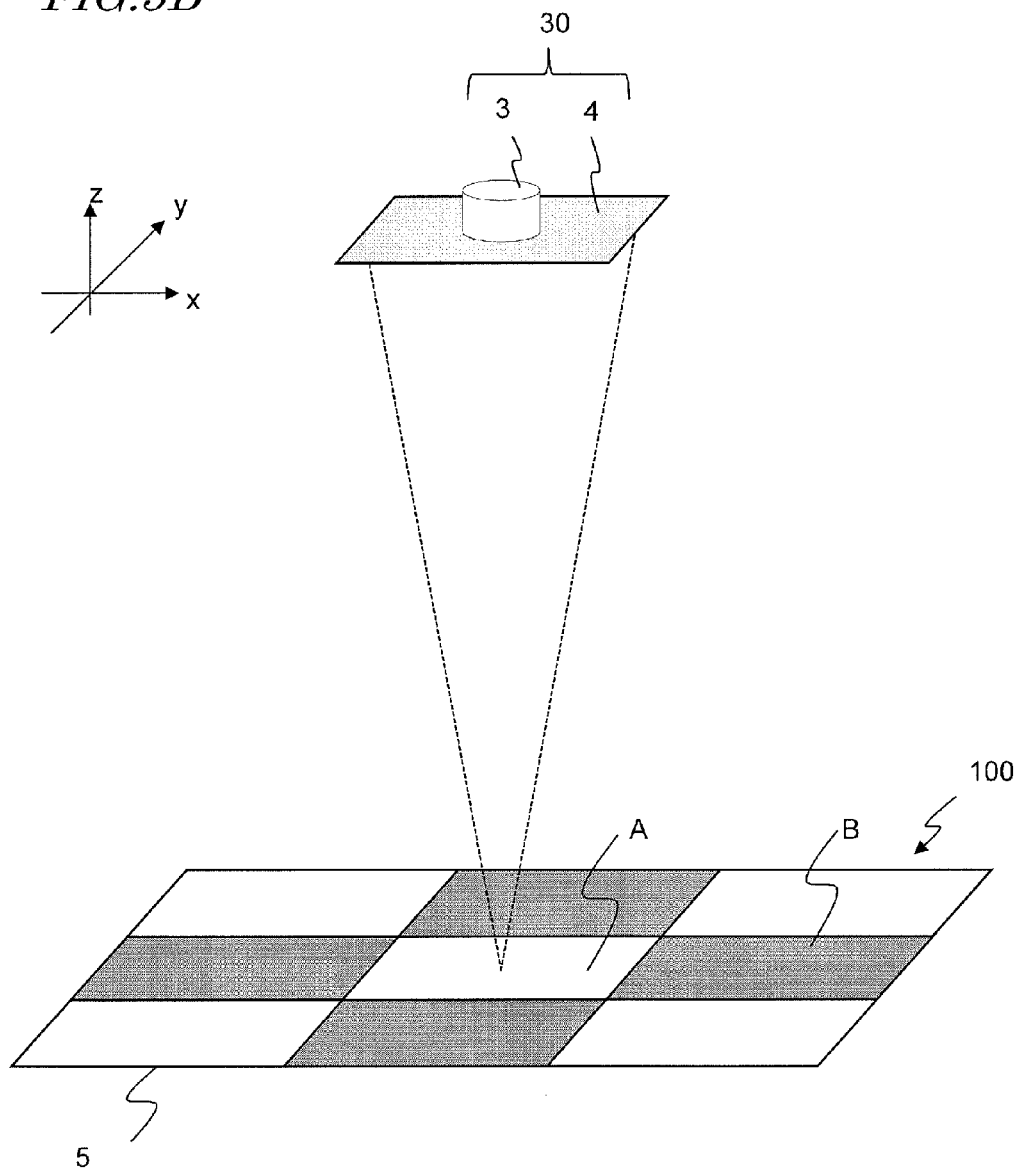
FIG. 5B schematically illustrates how a single light-splitting element 30 makes light beams falling within the first wavelength range (as indicated by the dotted lines) incident on the first type of photodetector A that the light-splitting element 30 faces.

FIG. 5A schematically illustrates how a single light-splitting element 30 makes light beams falling within the second wavelength range (as indicated by the dotted lines) incident on four photodetectors B of the second type which are adjacent to the first type of photodetector A that the light-splitting element 30 faces. On the other hand, FIG. 5B schematically illustrates how the light-splitting element 30 makes a light beam falling within the first wavelength range (as indicated by the dotted lines) incident on the first type of photodetector A that the light-splitting element 30 faces. If the visible light wavelength range and a part of the infrared light wavelength range have been selected as the first and second wavelength ranges, respectively, the light falling within the second wavelength range that has been incident on the light-splitting element 30 will enter the second photodetector B as shown in FIG. 5A. Meanwhile, the light falling within the first wavelength range that has been incident on the light-splitting element 30 will enter the first type of photodetector A (unless there is a color filter) as shown in FIG. 5B. If a color filter is arranged on the first type of photodetector A, on the other hand, the light that has been transmitted through the light-splitting element 30 and that color filter will enter the first type of photodetector A.

Now take a look at FIG. 3 again. On each photodetector B of the second type over which no light-splitting element 30 is arranged, light that has passed through a portion of the light-splitting element array 200 where there is no light-splitting element 30 may be incident directly. In addition to such directly incident light, light falling within the second wavelength range that should have been incident on the first type of photodetector A without the light-splitting element 30 will also be incident on the second type of photodetector B, because the light-splitting element 30 works as described above. Since light beams falling within the second wavelength range are incident densely on the second type of photodetector B in this manner, the sensitivity to that light increases. If a color filter which either cuts or attenuates the light falling within the first wavelength range is arranged right over the second type of photodetector B, the sensitivity of the second type of photodetector B to the light falling within the second wavelength range further increases.

In this example, each light-splitting element 30 is supposed to be arranged so as to face its associated photodetector A of the first type. However, the light-splitting elements 30 do not have to be arranged so as to face every photodetector A of the first type. For instance, an embodiment in which no light-splitting element 30 faces a first type of photodetector A that senses a particular color may also be adopted. Furthermore, even if some of the light-splitting elements 30 are omitted in either a regular pattern or a random pattern, the infrared light detecting sensitivity should increase overall thanks to the action of the remaining light-splitting elements 30.

Optionally, in the configuration shown in FIG. 1, a filter layer which cuts a light ray falling within a particular wavelength range may also be arranged over the light-splitting element array 200 (i.e., so as to be more distant from the photodetector array 100 than the light-splitting element array 200 is). For example, an infrared cut filter layer which cuts infrared light falling within a wavelength range in which an infrared image to be captured does not have to be generated may be arranged there. Even if such an infrared cut filter is provided, there will still be infrared light to be transmitted through the infrared cut filter, and therefore, an image can also be obtained based on the infrared light falling within the required wavelength range.

Hereinafter, embodiments of the present disclosure will be described more specifically.

Figure 6:
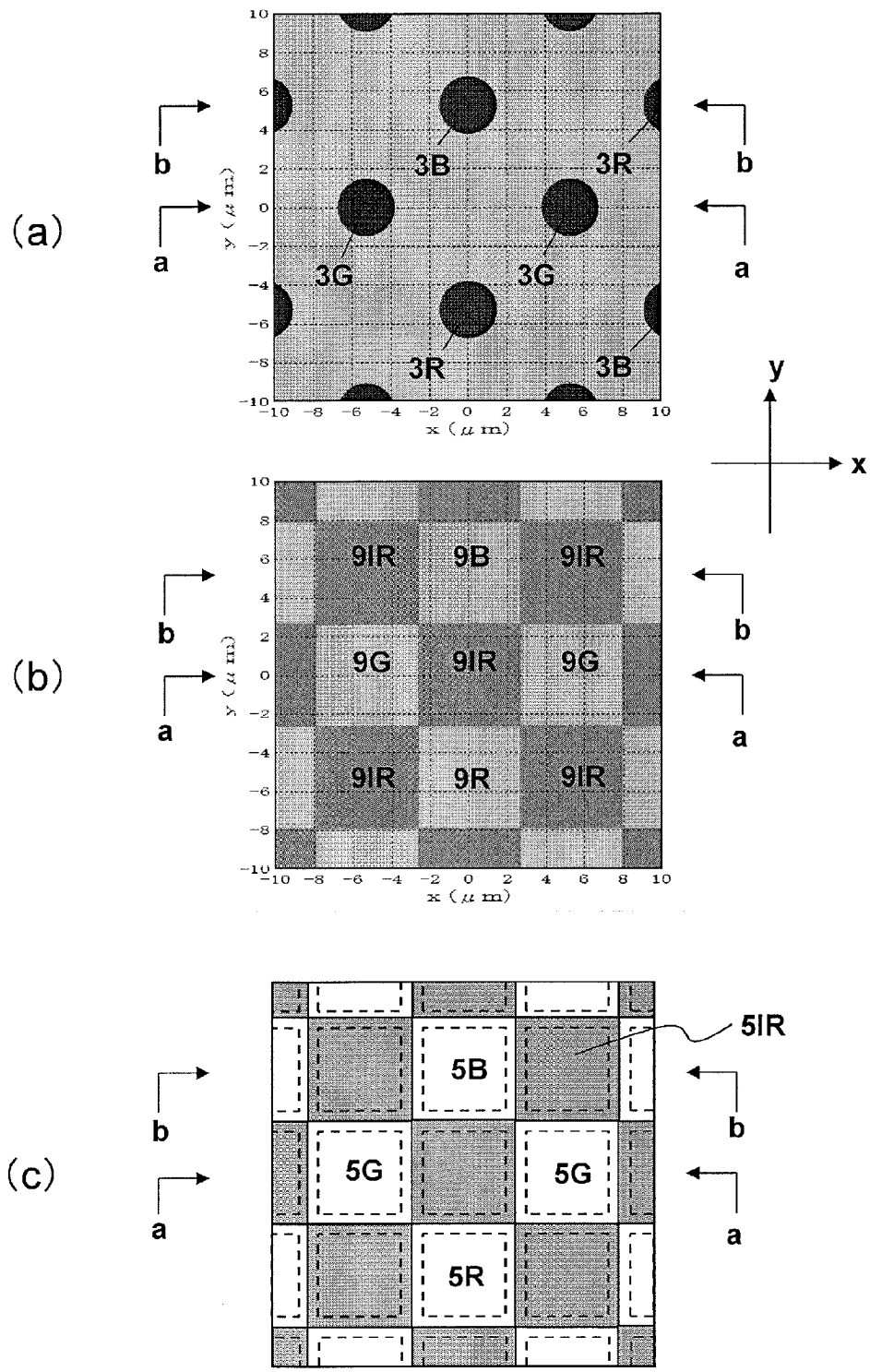
FIG. 6 shows plan views of the arrangement of the present disclosure, wherein (a) is a plan view illustrating an exemplary arrangement of phase filters 3R, 3G and 3B according to this embodiment. (b) is a plan view illustrating an exemplary arrangement of color filters 9R, 9G, 9B and 9IR. And (c) is a plan view illustrating an exemplary arrangement of photodetectors 5R, 5G, 5B and 5IR.

FIG. 6(*a*) is a plan view illustrating an exemplary arrangement of phase filters 3R, 3G and 3B according to this embodiment. FIG. 6(*b*) is a plan view illustrating an exemplary arrangement of color filters 9R, 9G, 9B and 9IR. And FIG. 6(*c*) is a plan view illustrating an exemplary arrangement of photodetectors 5R, 5G, 5B and 5IR.

The phase filters 3R, 3G and 3B shown in FIG. 6(*a*) are configured to create a phase difference of $2\pi$ responsive to light beams representing the colors red (R), green (G) and blue (B), respectively. Each of these phase filters 3R, 3G and 3B has a structure in which a transparent material with a relatively high refractive index is embedded in a transparent layer of a material with a relatively low refractive index. In the example illustrated in FIG. 6(*a*), all of these phase filters 3R, 3G and 3B have a columnar shape and their height (i.e., their size as measured in the Z-axis direction) changes from one color to another. By adjusting independently the respective heights of those columnar structures that form these phase filters 3R, 3G and 3B, these phase filters 3R, 3G and 3B can create a phase difference of $2\pi$ responsive to light beams representing the colors red (R), green (G) and blue (B), respectively.

The color filters 9R, 9G and 9B shown in FIG. 6(*b*) respectively cover the photodetectors 5R, 5G and 5B shown in FIG. 6(*c*), i.e., the first type of photodetectors A, and are arranged so that the visible light beams transmitted through the phase filters 3R, 3G and 3B are incident on the photodetectors 5R, 5G and 5B, respectively. In FIG. 6(*c*), the grey rectangular areas represent photodetectors 5IR on which infrared rays are incident, i.e., pixel regions where the second type of photodetectors B are located. The color filters 9IR cover those photodetectors 5IR to detect infrared rays and cut the visible light beams. Such a color filter 9IR can be obtained easily by stacking color filters 9R and 9B one upon the other, for example.

As shown in FIG. 6(*b*), according to the color filter arrangement of this example in which nine color filters are arranged in three columns and three rows, four 9R, 9G, 9G and 9B out of the nine color filters transmit visible light beams and the other five color filters 9IR transmit infrared light beams. These four color filters that transmit visible light beams include two filters that transmit color green (G) light beams. This is done in order to increase the quantity of the color green (G) light beams received, because the human visibility becomes the highest with respect to the color green (G) light beam. The arrangement shown in FIG. 6(*b*) has a configuration in which pixel regions to detect infrared rays are inserted into a normal Bayer arrangement.

In FIG. 6(*c*), there are dotted square areas in the checkerboard pattern to schematically represent the photosensitive areas (or photosensing areas) of the photodetectors 5R, 5G, 5B and 5IR. In other words, in FIG. 6(*c*), there are photosensing areas indicated by the smaller dashed squares inside pixel regions indicated by the larger solid squares. That is to say, not the entire pixel region has to be a photosensing area to do photoelectric conversion (such as a photodiode). Each of these photodetectors 5R, 5G, 5B and 5IR includes an element area other than the photosensing area, and the planar shape of the photosensing area does not have to agree with the profile of the pixel region. In this embodiment, the respective photosensing areas of the photodetectors 5R, 5G, 5B and 5IR are not in contact with each other but spaced apart from each other parallel to the image capturing plane. Although the first and second types of photodetectors A and B having a square planar shape are illustrated in FIGS. 2, 3, 5A, 5B and other drawings as if they contacted with each other, for the sake of simplicity, the first and second types of photodetectors A and B do not have to contact with each other in an actual solid-state image sensor. Also, even though there can be lines and an opaque metallic layer between the first and second types of photodetectors A and B, their illustration is omitted in those drawings.

Figure 7:
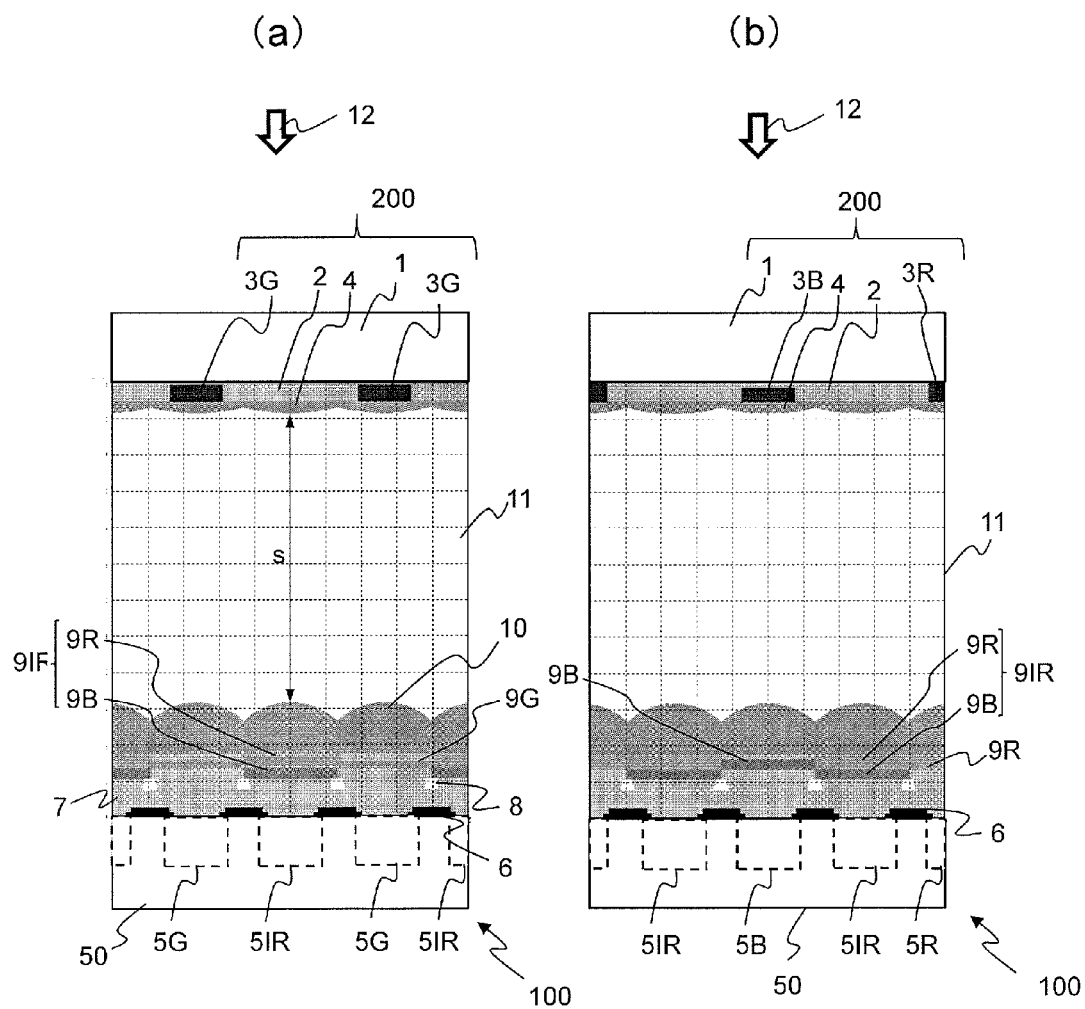
FIG. 7 shows cross-sectional views of the arrangement of the present disclosure, wherein (a) is a cross-sectional view as viewed on the plane a-a shown in FIG. 6, and (b) is a cross-sectional view as viewed on the plane b-b shown in FIG. 6.

FIG. 7(a) is a cross-sectional view as viewed on the plane a-a shown in FIG. 6, and FIG. 7(b) is a cross-sectional view as viewed on the plane b-b shown in FIG. 6. As shown in FIG. 7, the light-splitting element array 200 of this embodiment includes a transparent substrate 1, a low-refractive-index transparent layer 2 which is supported by the transparent substrate 1, phase filters 3B, 3G and 3R which are embedded in the transparent layer 2, and micro lenses 4 which are supported by the transparent layer 2.

Meanwhile, the photodetector array 100 of this embodiment includes a silicon substrate 50 on which photodetectors 5R, 5G, 5B and 5IR have been formed, an opaque metallic layer 6 and a low-refractive-index transparent layer 7 which are stacked in this order on the silicon substrate 50, and metal interconnects 8, color filters 9B, 9G, 9R and 9IR, and top lenses 10 which are arranged in this order on the transparent layer 7.

The opaque metallic layer 6 is formed out of a metal film which has been patterned so as to shield the boundary portions between the photodetectors 5R, 5G, 5B and 5IR from incoming light. The transparent layer 7 may be made of a transparent insulating material such as $SiO_2$ and covers the principal surface of the silicon substrate 50. The metal interconnects 8 play the role of electrically connecting the photodetectors 5R, 5G, 5B and 5IR to drivers and other peripheral circuits. The respective top lenses 10 are arranged so as to cover their associated color filters 9B, 9G, 9R and 9IR and increase the aperture ratio substantially by raising the condensing ratio.

As shown in FIG. 7(a), a distance s is left between the light-splitting element array 200 and the photodetector array 100 with an air layer 11 interposed between them. Alternatively, a layer made of any dielectric material other than the air may be provided between the light-splitting element array 200 and the photodetector array 100.

Incoming light 12 is transmitted through the light-splitting element array 200 and then incident on any of the top lenses 10. After that, the incoming light 12 is condensed by the top lens 10, transmitted through any of the color filters 9B, 9G, 9R and 9IR, and then incident on any of the photodetectors 5R, 5G, 5B and 5IR which is located right under that color filter. Each of the photodetectors 5R, 5G, 5B and 5IR generates an electrical signal representing the quantity of the light received by photoelectric conversion.

Thanks to the action of the light-splitting element array 200, at least part of the infrared light that would be incident on any of the photodetectors 5R, 5G and 5B were it not for the phase filters 3R, 3G and 3B is incident on the photodetector 5IR that is adjacent to that photodetector 5R, 5G or 5B.

The light-splitting element array 200 shown in FIG. 7 may be fabricated in the following manner, for example.

First of all, a transparent layer 2 of $SiO_2$, for example, is grown on a transparent substrate 1 by a known thin-film deposition technique. Next, the transparent layer 2 is patterned by photolithographic and etching techniques to cut three kinds of recesses with mutually different depths through a predetermined region of the transparent layer 2. Thereafter, a layer of a transparent material with a relatively high refractive index such as SiN (which will be referred to herein as a "high-refractive-index material") is deposited to cover the patterned transparent layer 2.

Subsequently, this layer of the high-refractive-index material is etched from its top surface, thereby exposing the surface of the transparent layer 2. In this manner, a transparent layer 2 in which structures of the high-refractive-index material (i.e., the phase filters 3R, 3G and 3B) are embedded can be obtained. By adjusting the etching process condition, the respective surfaces of the phase filters 3R, 3G and 3B and the transparent layer 2 can be planarized sufficiently. The phase filters 3B, 3G and 3R of this embodiment are high-refractive-index columnar structures which are isolated inside the transparent layer 2 with a relatively low refractive index. As shown in FIG. 6(a), the phase filters 3B, 3G and 3R of this embodiment have a circular planar shape. However, the planar shape of the phase filters 3B, 3G and 3R does not have to be a circular one but may also be a diamond or square one, for example. The shape and size of the phase filters 3B, 3G and 3R may be set arbitrarily by adjusting the shape and size of the recesses to be cut through the transparent layer 2 before a layer of the high-refractive-index transparent material is deposited.

Finally, an array of micro lenses 4 is formed on the planarized surface of the transparent layer 2 to obtain a light-splitting element array 200. In this embodiment, each micro lens 4 contacts with its adjacent micro lenses 4 along the square borders. In other words, the lens surface of each micro lens 4 covers the entire square area that is defined by the size of a pixel. The micro lenses 4 have the effects of enhancing the condensing interference (to be described later) and shortening the distance s between the light-splitting element array 200 and the photodetector array 100. It should be noted that no micro lens 4 needs to be provided so as to face an infrared light detector 5IR. It can be said that if there is no need to shorten the optical distance s in the first place, no micro lenses 4 should be provided where there are the phase filters 3B, 3G and 3R.

However, this method of fabricating the light-splitting element array 200 is just an example and does not always have to be adopted. For example, an array of micro lenses 4 may be formed on the transparent substrate 1 and may have its surface patterned to cut recesses with multiple depths in the predetermined region. In that case, the micro lenses 4 will have the same shape as Fresnel lenses. The light-splitting element array 200 thus fabricated is combined and integrated together with the photodetector array 100 that has been fabricated separately. In this process step, alignment is carried out between the light-splitting element array 200 and the photodetector array 100 and the light-splitting element array 200 is fixed onto the photodetector array 100 with a supporting member (not shown). In this description, "to make alignment" means making the respective center positions (i.e., their X and Y coordinates) of the phase filters 3B, 3G and 3R agree with the respective center positions (i.e., their X and Y coordinates) of the photosensing areas of their associated photodetectors 5B, 5G and 5IR when viewed perpendicularly to the image capturing plane. In this case, the respective center positions (i.e., their X and Y coordinates) of the micro lenses 4 are also made to agree with the respective center positions (i.e., their X and Y coordinates) of the photosensing areas of the photodetectors 5R, 5G, 5B and 5IR. The magnitude of misalignment is suitably as small as possible and may be set to be 1.5 μm or less, for example.

The magnitudes of the phase level differences created by the phase filters 3B, 3G and 3R are set to be approximately $2\pi$ with respect to the colors blue, green and red wavelength ranges, respectively. Since the colors blue, green and red wavelength ranges have a certain width, the phase filters 3B, 3G and 3R may be designed so that a phase difference of $2\pi$ is created with respect to the center value of each width.

The air layer's (11) thickness (which may fall within the range of 10 to 20 μm, for example) can be kept substantially constant by arranging spacers (not shown). If the gap is filled with resin instead of providing the air layer 11, the micro lenses 4 and the top lenses 10 need to be made of a material which has a sufficiently higher refractive index (such as SiN) than resin to maintain the optical power of the micro lenses. The interval between the light-splitting element array 200 and the photodetector array 100 may be set so that the tip of the top lenses 10 is located on the focal plane of the micro lenses 4.

Hereinafter, the results of wave calculations that were carried out based on the light-splitting principle of the phase filters 3 of the light-splitting element array 200 will be described with reference to FIGS. 8 through 19.

Figure 8:
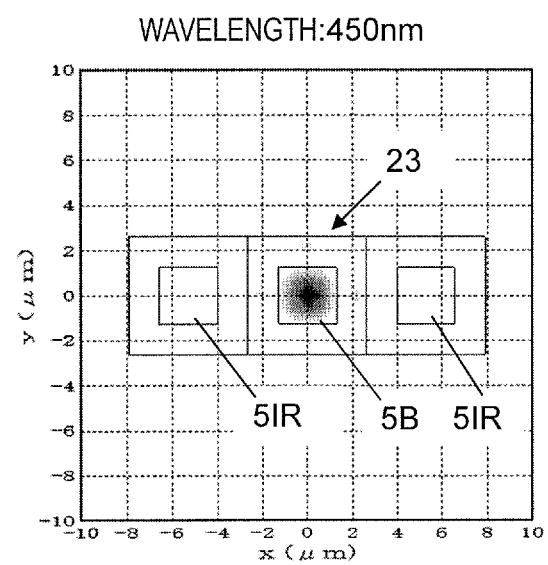
FIG. 8 shows the in-plane intensity distributions at the tip of the top lens 10 in a situation where light was incident on a light-splitting element located at the center of a region of interest, wherein (a) shows the intensity distribution of a light beam with a wavelength of 450 nm and (b) shows the intensity distribution of an infrared light beam with a wavelength of 850 nm.
Figure 8:
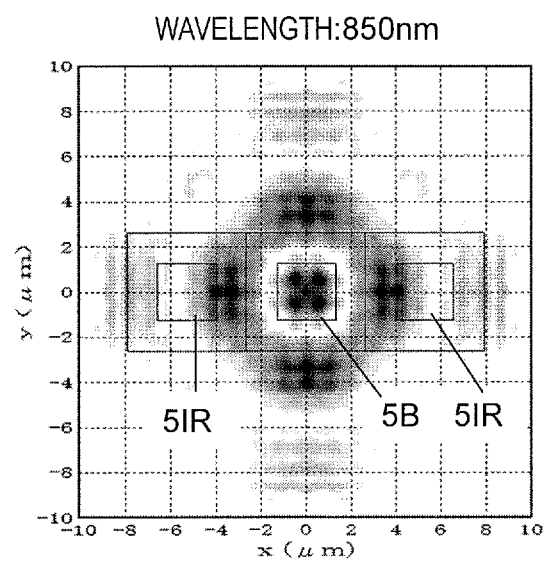
Figure 9:
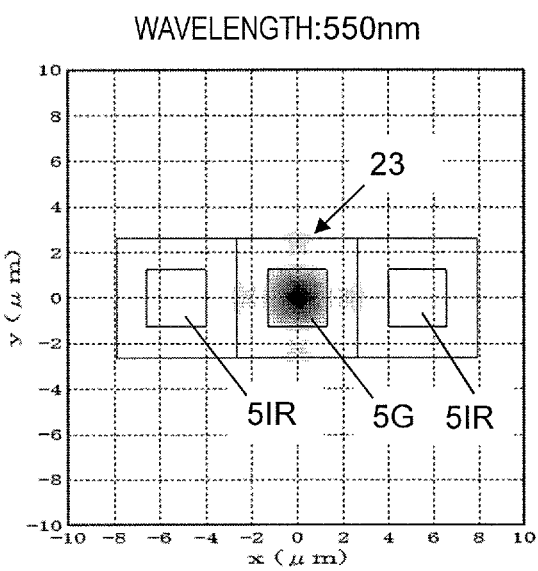
FIG. 9 shows the in-plane intensity distributions at the tip of the top lens 10 in a situation where light was incident on a light-splitting element located at the center of a region of interest, wherein (a) shows the intensity distribution of a light beam with a wavelength of 550 nm and (b) shows the intensity distribution of an infrared light beam with a wavelength of 850 nm.
Figure 9:
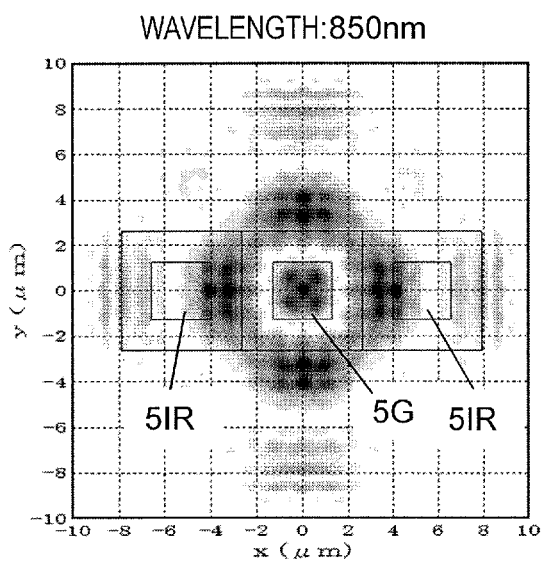
Figure 10:
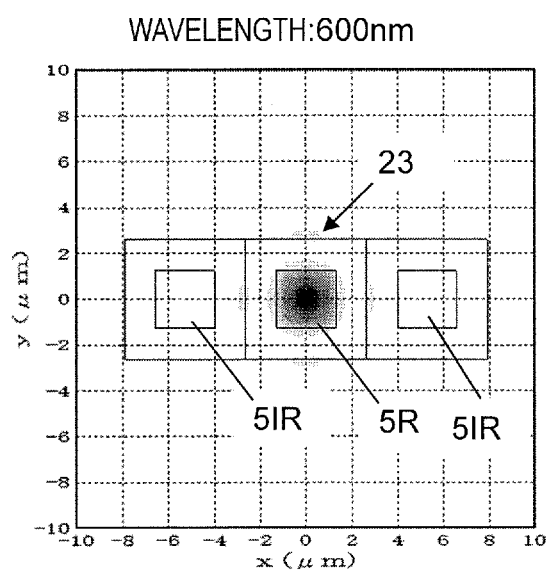
FIG. 10 shows the in-plane intensity distributions at the tip of the top lens 10 in a situation where light was incident on a light-splitting element located at the center of a region of interest, wherein (a) shows the intensity distribution of a light beam with a wavelength of 600 nm and (b) shows the intensity distribution of an infrared light beam with a wavelength of 850 nm.
Figure 10:
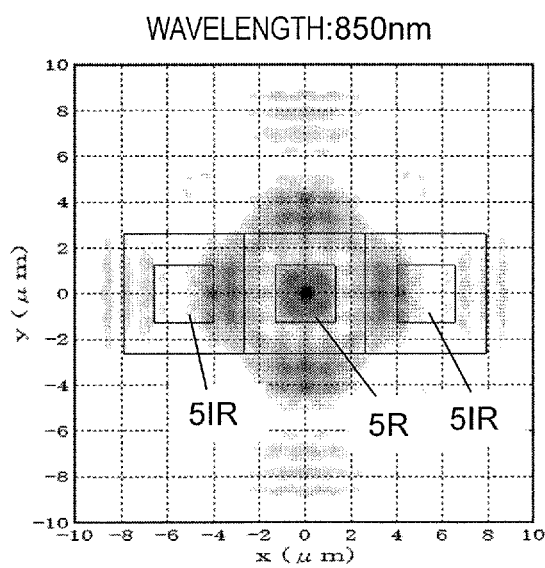

FIGS. 8 to 10 show the in-plane intensity distributions at the tip of the top lenses 10 (i.e., at the distance s of 17 μm as measured from the tip of the micro lenses 4) when light was incident on a light-splitting element located at the center of the region under analysis. In these drawings, portions (a) represent the intensity distributions of visible light beams (with wavelengths of 450, 550 and 600 nm) and portions (b) represent the intensity distributions of an infrared light beam (with a wavelength of 850 nm). In these drawings, the lower the lightness (i.e., the closer to the color black), the higher the light intensity. Since the micro lenses 4 have a radius of curvature of 12 μm and the material of the micro lenses 4 has a refractive index of approximately 1.5, s=12×2/1.5=16 μm corresponds to the focal plane position. In these drawings, the three squares 23 which are arranged side by side indicate the boundaries between three pixel regions. The photodetectors 5B, 5G, 5R and 5IR are partitioned by a grid-like opaque metallic layer 6 which covers the boundaries between the pixel regions.

First of all, look at FIG. 8. FIG. 8(a) shows the intensity distribution of a light beam with a wavelength of 450 nm in a situation where white light including infrared light was incident on a light-splitting element that was located at a color blue light detector 5B. Meanwhile, FIG. 8(b) shows the intensity distribution of a light beam with a wavelength of 850 nm in such a situation. The intensity distribution shown in FIG. 8(a) corresponds to the one shown in FIG. 4(b) and the intensity distribution shown in FIG. 8(b) corresponds to the one shown in FIG. 4(c).

As can be seen from FIG. 8(a), an area where the light with the wavelength of 450 nm has a high intensity is located within the area allocated to the photodetector 5B. This result reveals that a component of light with a wavelength of 450 nm which is included in the light that has been incident on a light-splitting element associated with the photodetector 5B has been transmitted straight through the phase filter of the light-splitting element as it is and then incident on the top lens 10 allocated to the photodetector 5 located right under phase filter. On the other hand, as can be seen from FIG. 8(b), an area where the light with the wavelength of 850 nm has a high intensity covers the area surrounding the photodetector 5B. This result reveals that a component of light with a wavelength of 850 nm which is included in the light that has been incident on a light-splitting element associated with the photodetector 5B has been interfered with by the phase filter of the light-splitting element and then incident on the top lens 10 allocated to the infrared light detector IR.

FIG. 9(a) shows the intensity distribution of a light beam with a wavelength of 550 nm in a situation where white light including infrared light was incident on a light-splitting element that was located at a color green light detector 5G. FIG. 10(a) shows the intensity distribution of a light beam with a wavelength of 600 nm in a situation where white light including infrared light was incident on a light-splitting element that was located at a color red light detector 5R. FIG. 9(b) shows the intensity distribution of a light beam with a wavelength of 850 nm in a situation where white light including infrared light was incident on the light-splitting element located at the color green light detector 5G. And FIG. 10(b) shows the intensity distribution of a light beam with a wavelength of 850 nm in a situation where white light including infrared light was incident on the light-splitting element located at the color red light detector 5R. As can be seen from FIGS. 9 and 10, what has already been described with reference to FIG. 9 can also be said about the green and red light beams. Nevertheless, the intensities of light beams having the wavelength of 850 nm decrease in the order of FIGS. 8(b), 9(b) and 10(b). This is because the sizes of the respective phase filters have been determined so as to create a phase level difference of 2π with respect to the wavelength (which is 450 nm, 550 nm or 600 nm) of the visible light to be transmitted. That is to say, if the visible light to be transmitted has a wavelength of 450 nm, the phase difference created by that phase filter with respect to a light beam with a wavelength of 850 nm has a value close to π. However, if the visible light to be transmitted has a wavelength of 600 nm, the phase difference created by that phase filter with respect to a light beam with a wavelength of 850 nm becomes significantly different from π.

Figure 11:
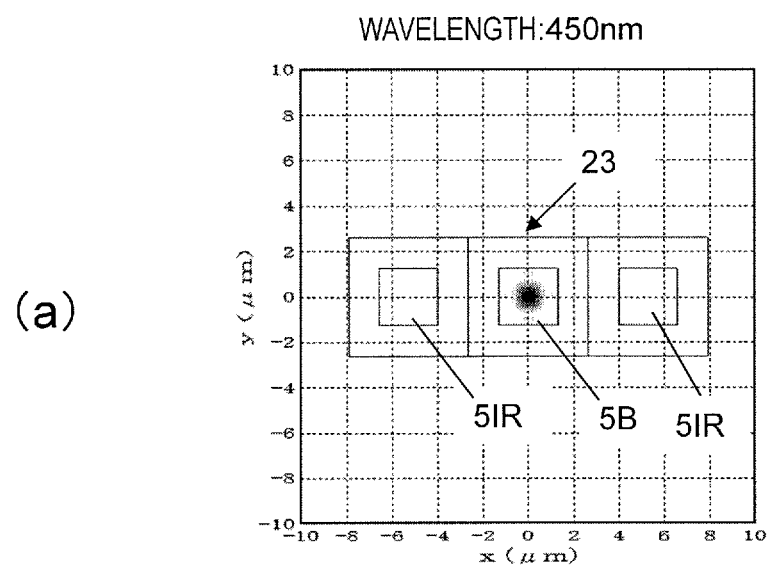
FIG. 11 shows the in-plane intensity distributions on the image capturing plane in a situation where light was incident on a light-splitting element located at the center of a region of interest, wherein (a) shows the intensity distribution of a light beam with a wavelength of 450 nm and (b) shows the intensity distribution of an infrared light beam with a wavelength of 850 nm.
Figure 11:
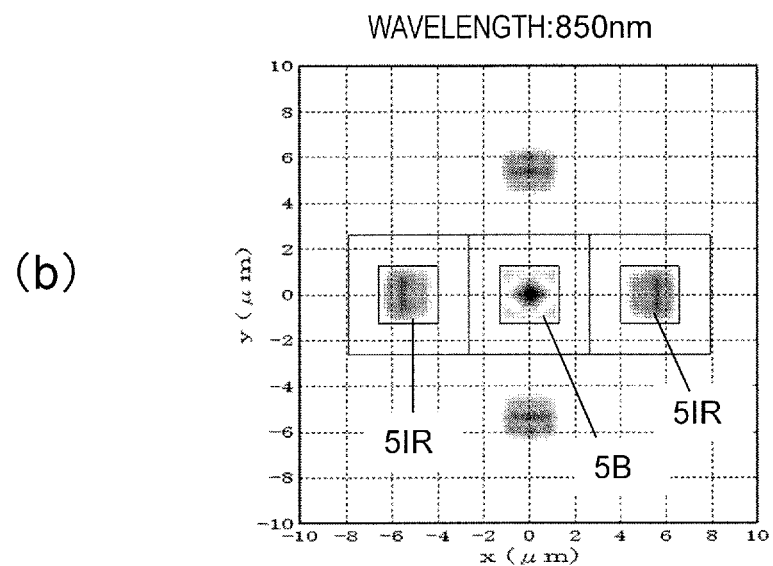
Figure 12:
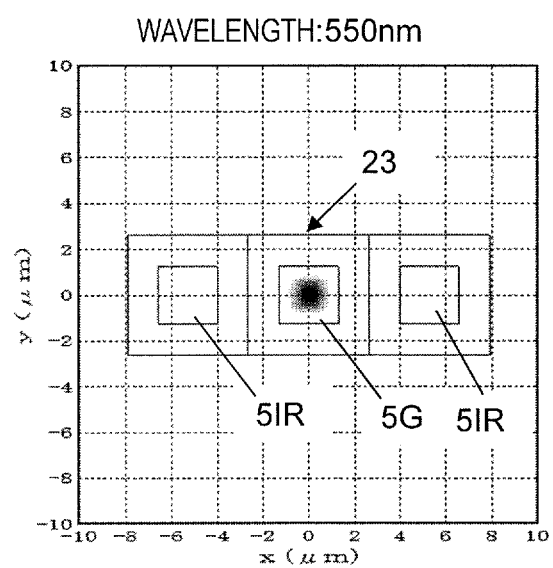
FIG. 12 shows the in-plane intensity distributions on the image capturing plane in a situation where light was incident on a light-splitting element located at the center of a region of interest, wherein (a) shows the intensity distribution of a light beam with a wavelength of 550 nm and (b) shows the intensity distribution of an infrared light beam with a wavelength of 850 nm.
Figure 12:
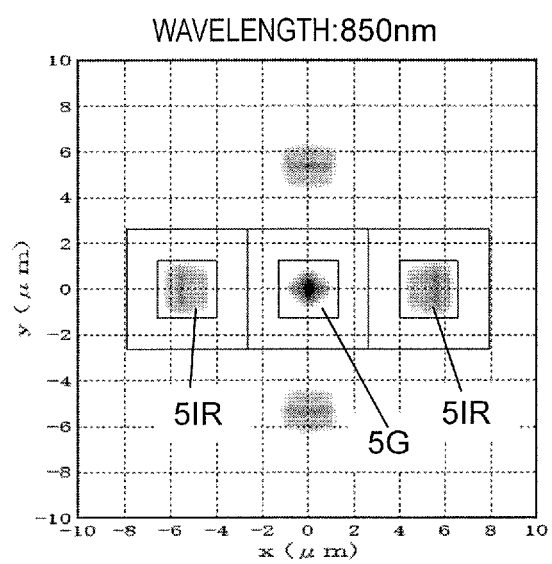
Figure 13:
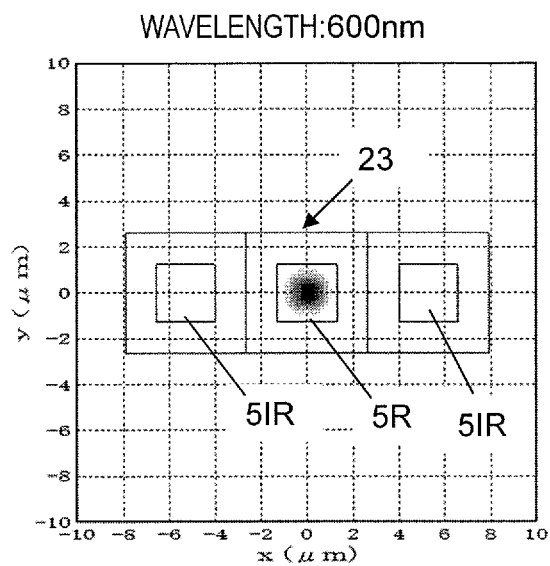
FIG. 13 shows the in-plane intensity distributions on the image capturing plane in a situation where light was incident on a light-splitting element located at the center of a region of interest, wherein (a) shows the intensity distribution of a light beam with a wavelength of 600 nm and (b) shows the intensity distribution of an infrared light beam with a wavelength of 850 nm.
Figure 13:
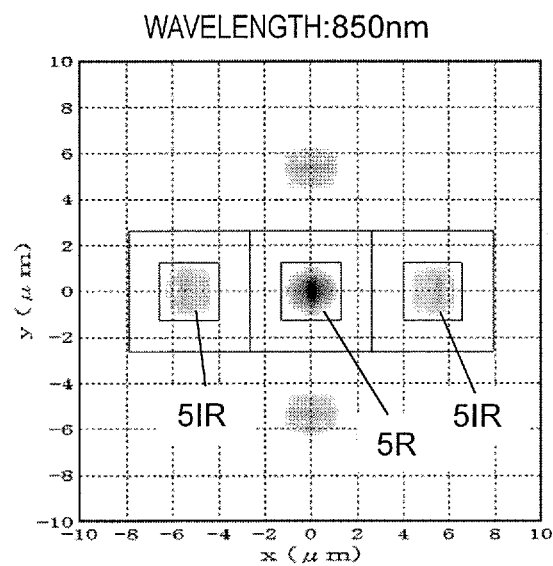

Next, look at FIGS. 11 to 13. These drawings do correspond to FIGS. 8 to 10, respectively, but the light intensity distributions were calculated at a different in-plane position. That is to say, FIGS. 11 to 13 represent light intensity distributions at the surface of the photodetectors (i.e., on the image capturing plane). As can be seen from FIGS. 11 to 13, the incoming light is condensed by the top lens 10, absorbed into the color filter 9 and then cut by the interconnect 8 and opaque metallic layer 6. As a result, a condensed beam spot can be obtained within each photodetector.

Figure 14:
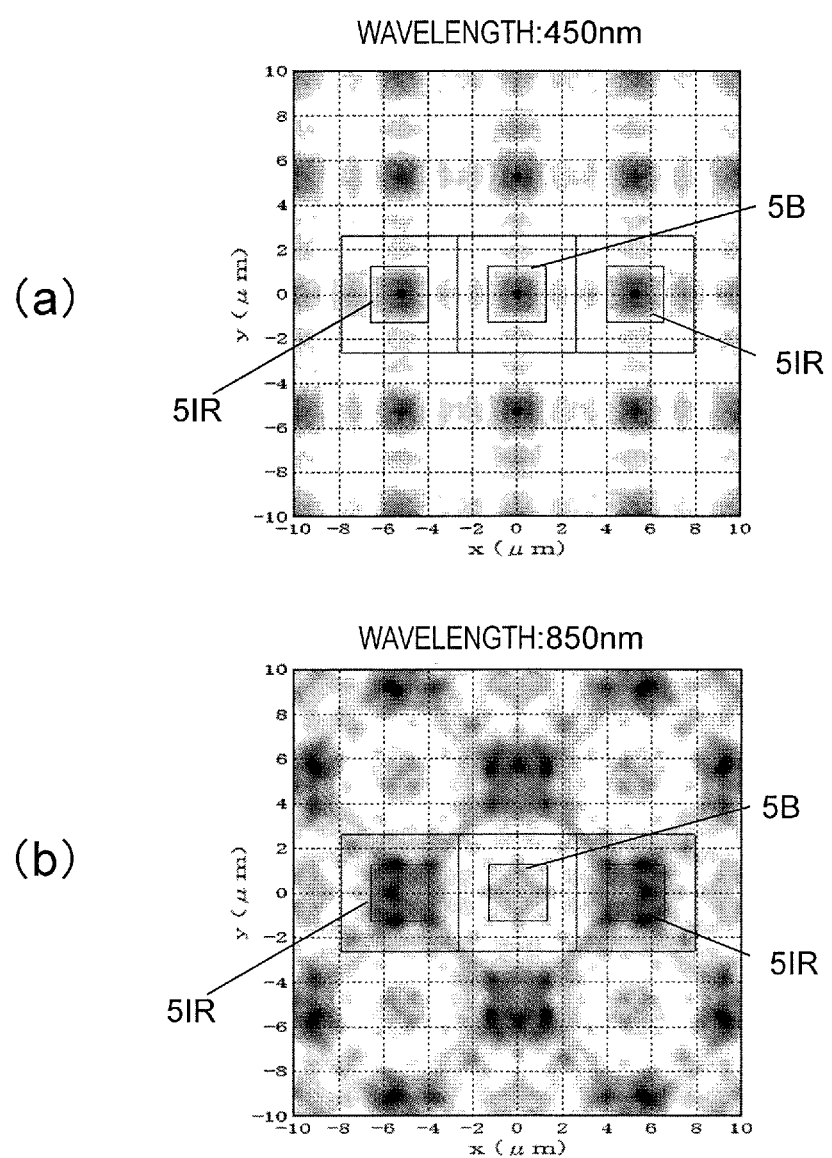
FIG. 14 shows the in-plane intensity distributions at the tip of the top lens 10 in a situation where light was incident on the entire region of interest, wherein (a) shows the intensity distribution of a light beam with a wavelength of 450 nm and (b) shows the intensity distribution of an infrared light beam with a wavelength of 850 nm.
Figure 15:
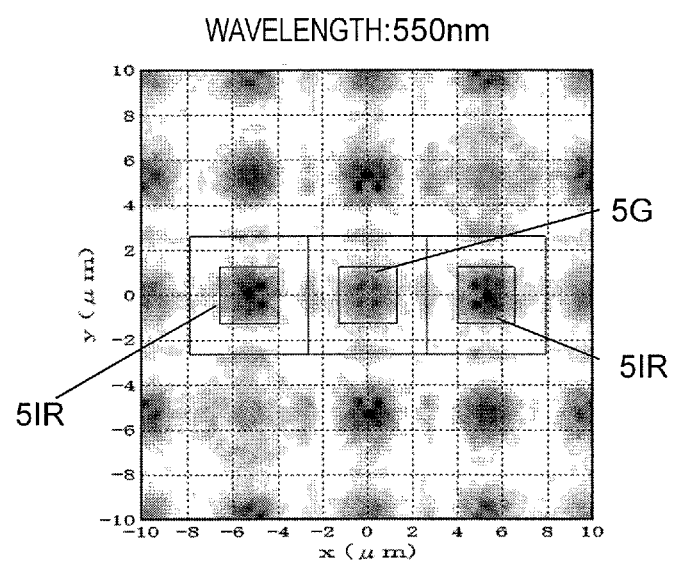
FIG. 15 shows the in-plane intensity distributions at the tip of the top lens 10 in a situation where light was incident on the entire region of interest, wherein (a) shows the intensity distribution of a light beam with a wavelength of 550 nm and (b) shows the intensity distribution of an infrared light beam with a wavelength of 850 nm.
Figure 15:
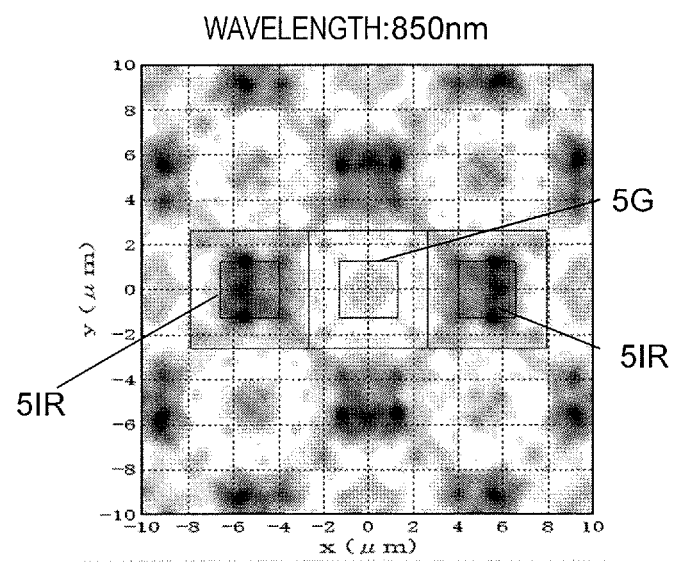
Figure 16:
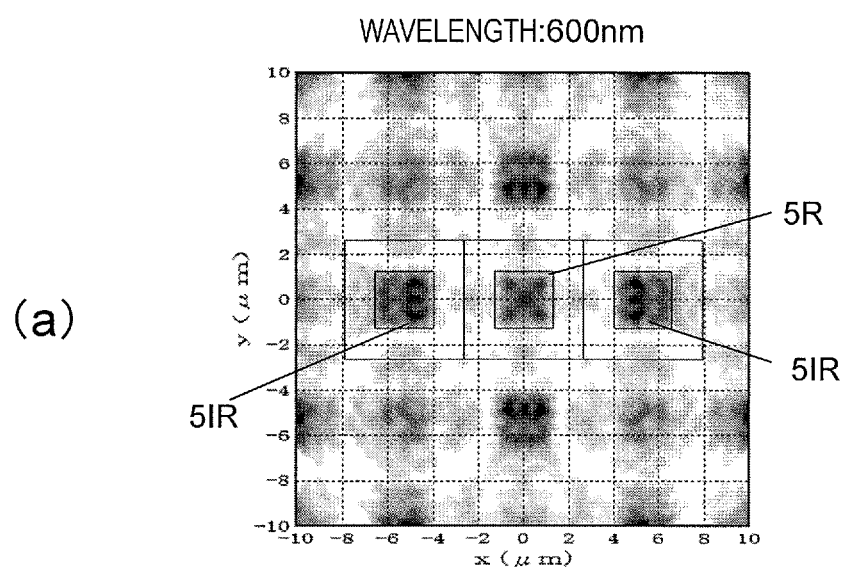
FIG. 16 shows the in-plane intensity distributions at the tip of the top lens 10 in a situation where light was incident on the entire region of interest, wherein (a) shows the intensity distribution of a light beam with a wavelength of 650 nm and (b) shows the intensity distribution of an infrared light beam with a wavelength of 850 nm.
Figure 16:
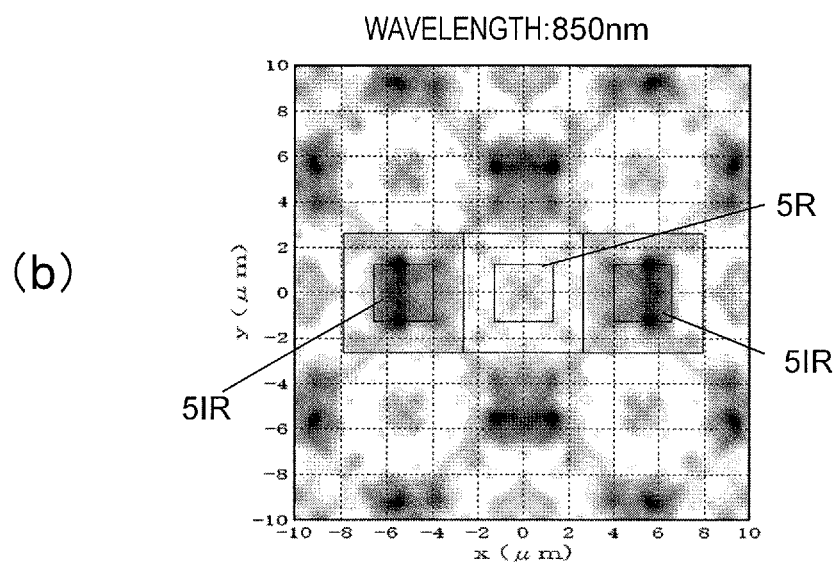
Figure 17:
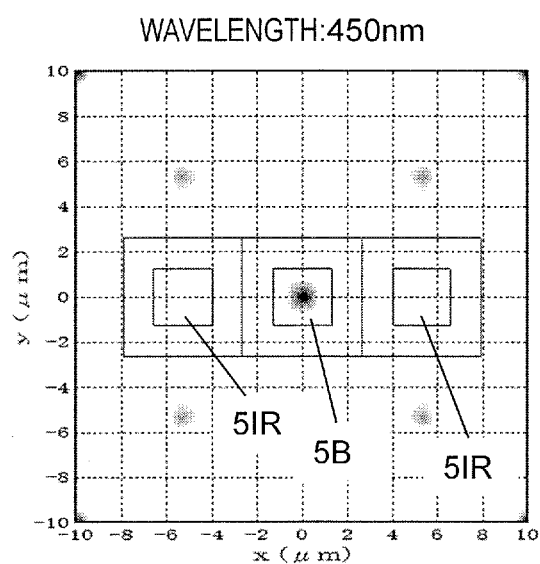
FIG. 17 shows the in-plane intensity distributions on the image capturing plane in a situation where light was incident on the entire region of interest, wherein (a) shows the intensity distribution of a light beam with a wavelength of 450 nm and (b) shows the intensity distribution of an infrared light beam with a wavelength of 850 nm.
Figure 17:
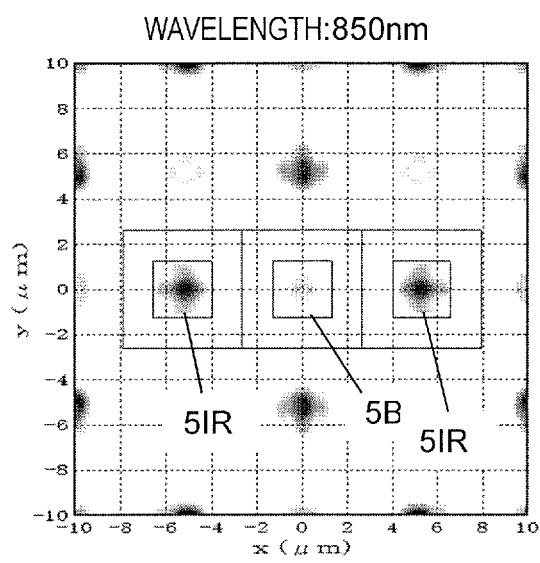
Figure 18:
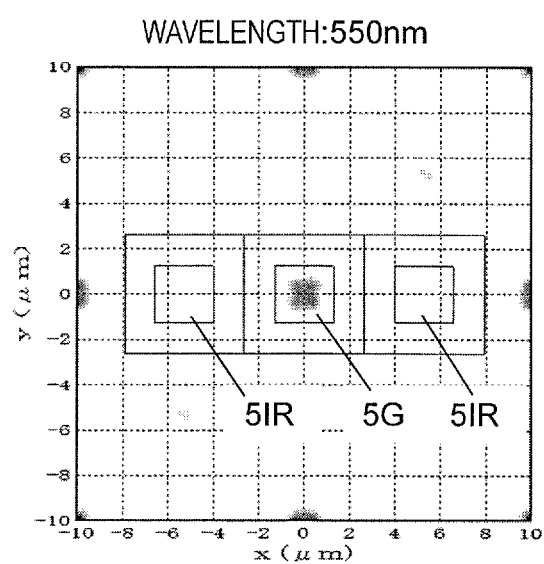
FIG. 18 shows the in-plane intensity distributions on the image capturing plane in a situation where light was incident on the entire region of interest, wherein (a) shows the intensity distribution of a light beam with a wavelength of 550 nm and (b) shows the intensity distribution of an infrared light beam with a wavelength of 850 nm.
Figure 18:
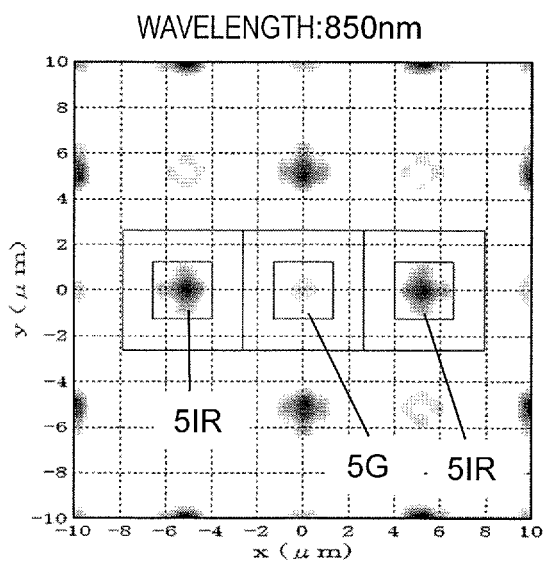
Figure 19:
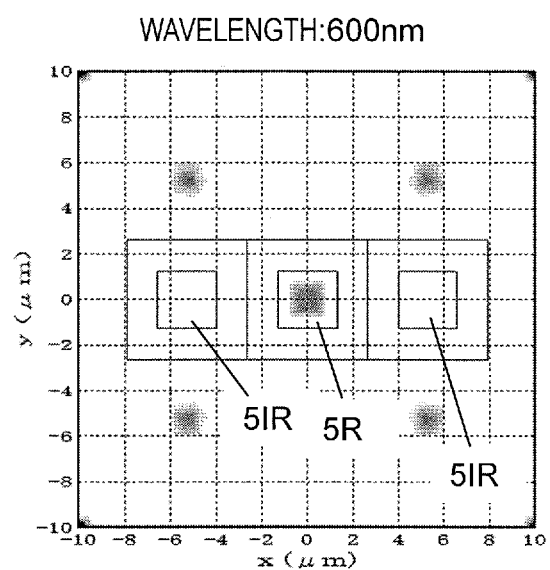
FIG. 19 shows the in-plane intensity distributions on the image capturing plane in a situation where light was incident on the entire region of interest, wherein (a) shows the intensity distribution of a light beam with a wavelength of 600 nm and (b) shows the intensity distribution of an infrared light beam with a wavelength of 850 nm.
Figure 19:
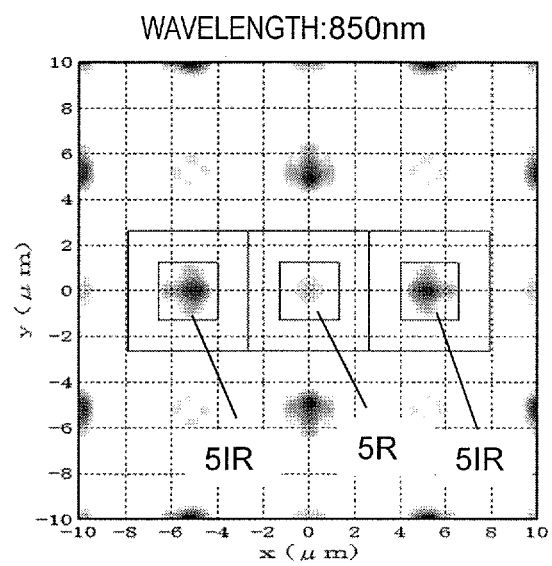

Next, FIGS. 14 to 19 will be referred to. In this case, the in-plane intensity distributions of light beams with respective wavelengths were calculated in a situation where light with a uniform intensity was incident on the entire surface of the region of interest. FIGS. 14 to 16 correspond to FIGS. 8 to 10, respectively. And FIGS. 17 to 19 correspond to FIGS. 11 to 13, respectively. As can be seen from these drawings, as for visible light, there was no bias in intensity distribution (i.e., energy distribution) between the photodetectors 5B, 5G, 5R and 5IR. As for infrared light, on the other hand, the intensity distribution was biased toward the infrared light detector 5IR. Also, as can be seen from FIGS. 17 to 19, visible light was condensed within the visible light detector and the infrared light was condensed within the infrared light detector. This means that infrared light could be detected after having been condensed efficiently within the infrared light detector 5IR.

Figure 20:
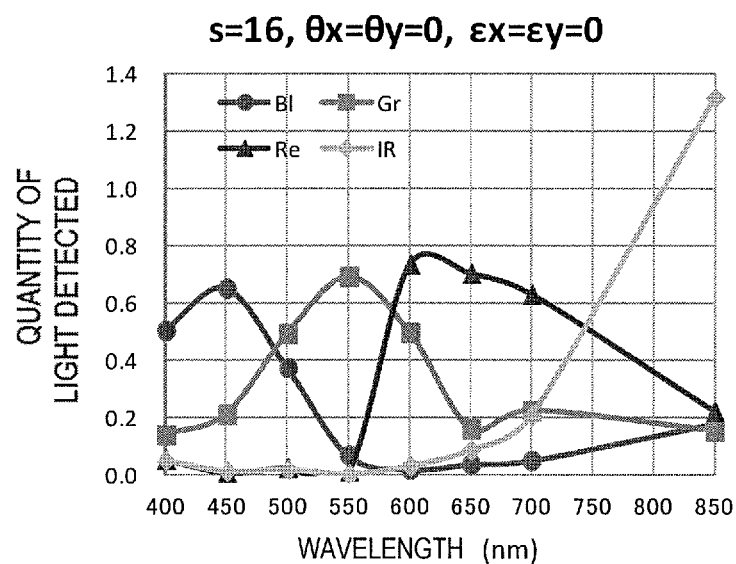
FIG. 20 is a graph showing a light-splitting property of a solid-state image sensor according to this embodiment.

FIG. 20 is a graph showing an exemplary light-splitting property of a solid-state image sensor according to this embodiment. In FIG. 20, the abscissa represents the wavelength and the ordinate represents the quantity of light detected. The "quantity of light detected" means the "detected light value" which is defined as the energy absorbed at the photodetector using normalized units (a value of 1.0 indicates the incident light value). In this graph, the quantities of light incident on the blue, green, red, and infrared light detectors 5B, 5G, 5R and 5IR are each normalized by the quantity of light incident per pixel and are indicated by the curves Bl, Gr, Re and IR, respectively.

Figure 21:
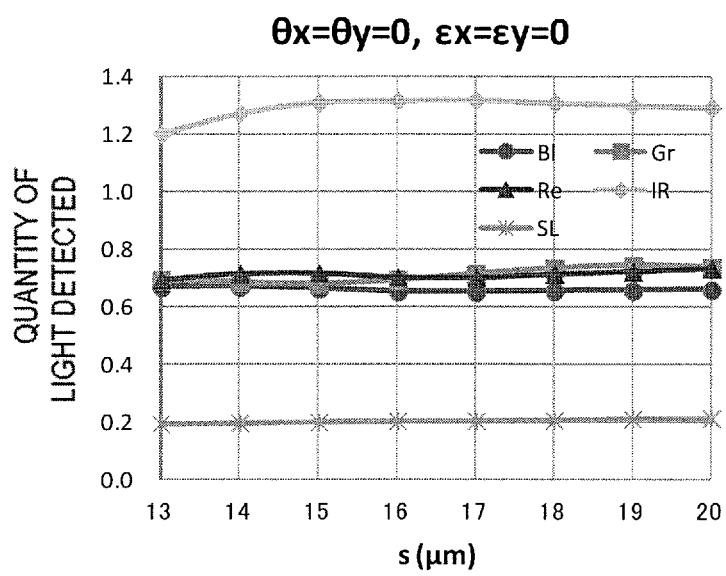
FIG. 21 is a graph showing the gap dependence of the quantity of light detected by a solid-state image sensor according to this embodiment.
Figure 22:
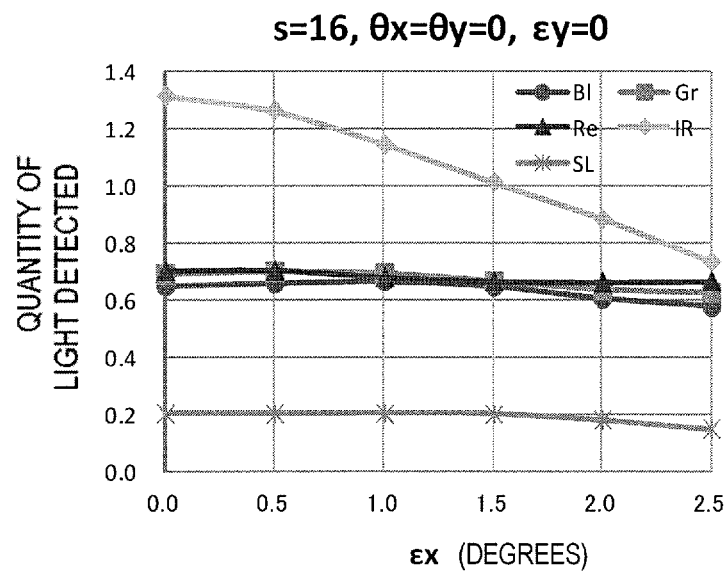
FIG. 22 is a graph showing the positional shift dependence of the quantity of light detected by a solid-state image sensor according to this embodiment.
Figure 23:
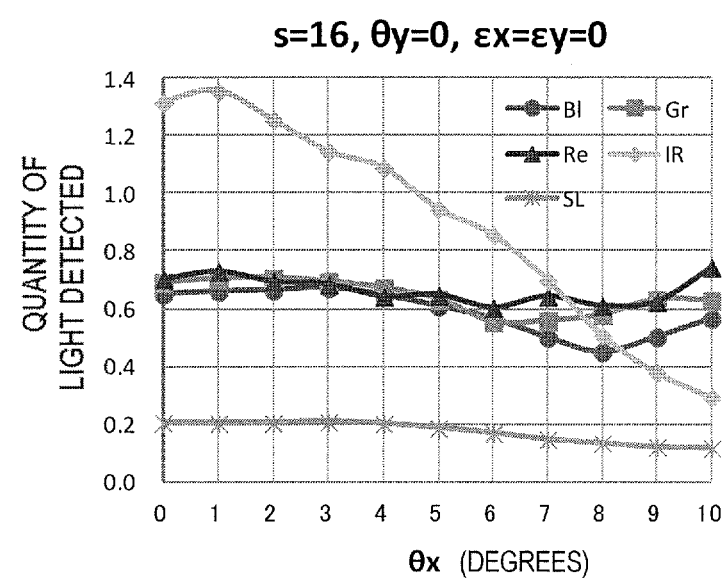
FIG. 23 is a graph showing the angle of incidence dependence of the quantity of light detected by a solid-state image sensor according to this embodiment.

FIGS. 21, 22 and 23 respectively show the gap dependence, positional shift dependence and angle of incidence dependence of the quantity of light detected. The gap dependence is represented by the distance s from the tip of the micro lens 4 to the tip of the top lens 10 on the axis of abscissas. The positional shift dependence is represented by the positional shift ∈x in the x direction of the phase filter with respect to the photodetector 5 on the axis of abscissas. And the angle of incidence dependence is represented by the tilt angle θx defined in the x direction by the incoming light 12 with respect to the photodetector 5 on the axis of abscissas. On the other hand, on the axis of ordinates in each of these graphs, the output values of the photodetectors 5B, 5G, 5R and 5IR at wavelengths of 450, 550, 600 and 850 nm are plotted by curves Bl, Gr, Re and IR, respectively.

Figure 30:
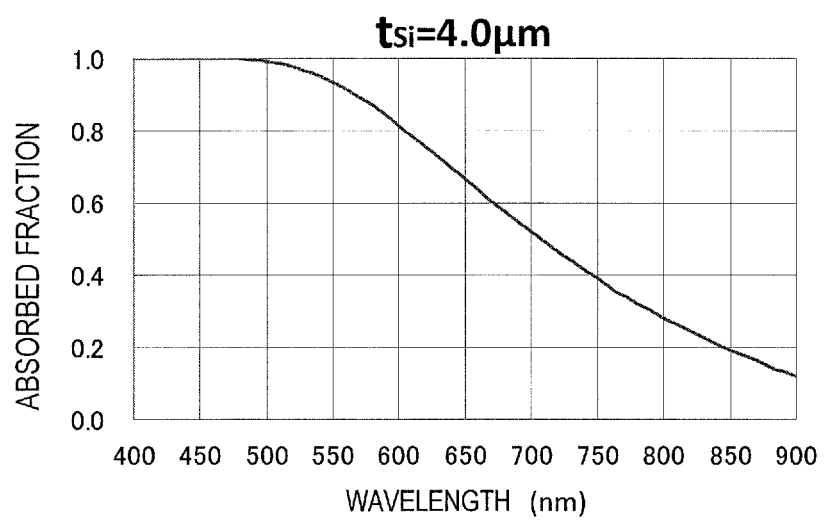
FIG. 30 is a graph showing the wavelength dependence of the light absorbed fraction of silicon.

In FIGS. 21, 22 and 23, the sum of the quantities of light detected by the infrared light detector 5IR shown in FIG. 21 (as indicated by the curve IR) in the visible radiation range (at 400, 450, 500, 550, 600 and 650 nm) is plotted by the curve SL. The value of the curve SL indicates the quantity of visible stray light component detected by the infrared light detector 5IR. The detection level of the infrared light (as indicated by the curve IR) is approximately 6.5 times as high as that of the visible stray light component (as indicated by the curve SL). This means that even when the difference in absorbed fraction that has already been described with reference to FIG. 30 is taken into consideration, the infrared light detection sensitivity is still higher than the visible stray light component detection sensitivity.

As described above, in an embodiment of the present disclosure, a photodetector is arranged at a distance of at least 5 μm from the phase filter in order to separate infrared light. The present inventors confirmed that if the distance from the phase filter to the photodetector was 5 μm or more when the pixel size was 5.6 μm and when the distance s from the tip of the micro lens 4 to the tip of the top lens 10 was 16 μm, the quantity of light could be detected most accurately. In addition, as also can be seen from FIG. 21, the effect could be achieved in a broad range including a range where s=13 to 20 μm. The present inventors confirmed that the same effect could be achieved even when the pixel size was 2.5 μm, for example.

Next, a comparative example will be described.

Figure 24:
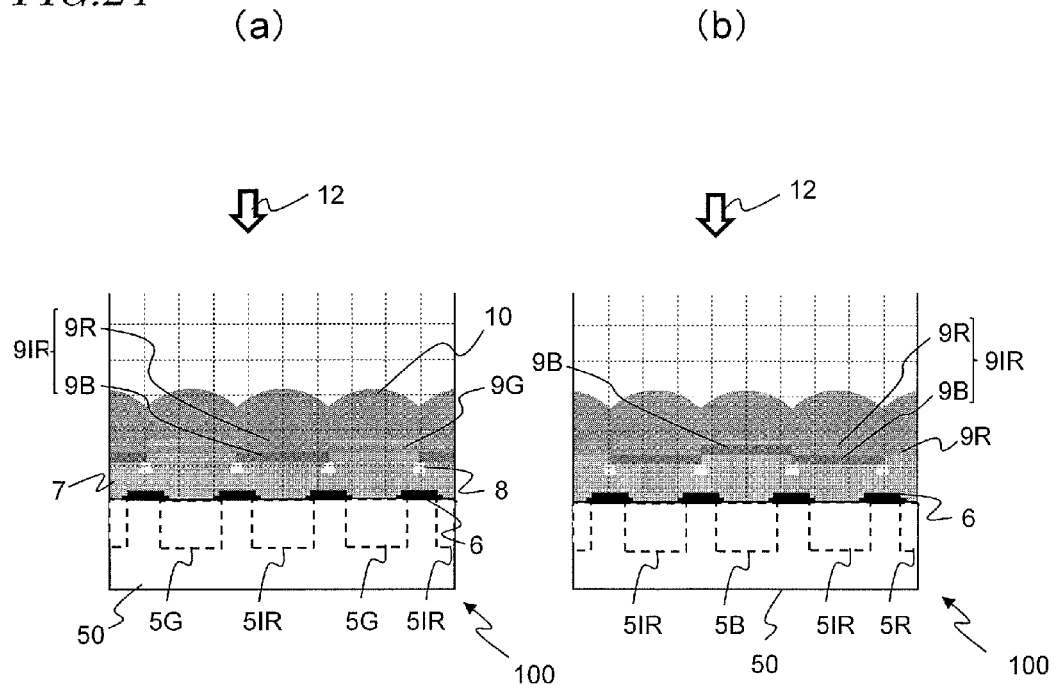
FIG. 24 shows cross-sectional views, wherein (a) and (b) illustrate cross-sectional structures of a solid-state image sensor as a comparative example.
Figure 25:
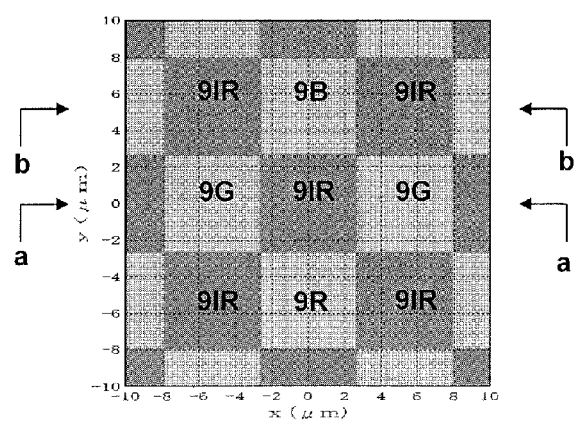
FIG. 25 is a plan view illustrating an arrangement pattern of color filters in the comparative example.
Figure 26:
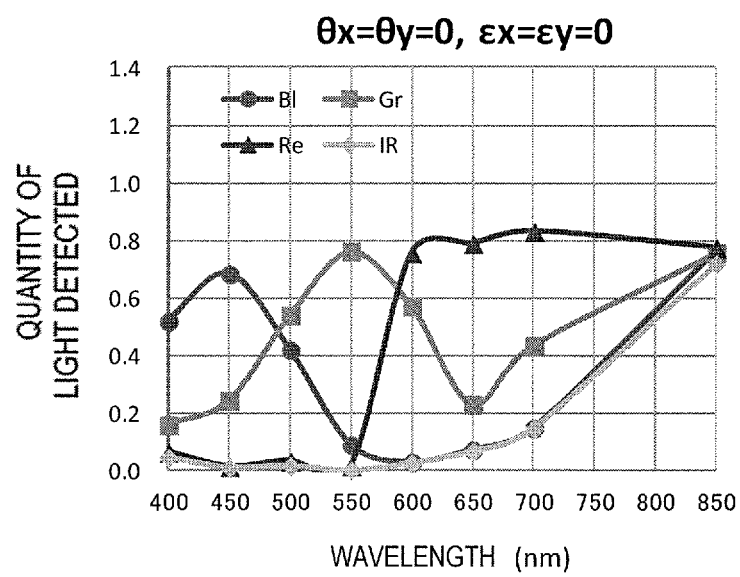
FIG. 26 is a graph showing the light-splitting property of the solid-state image sensor of the comparative example.
Figure 27:
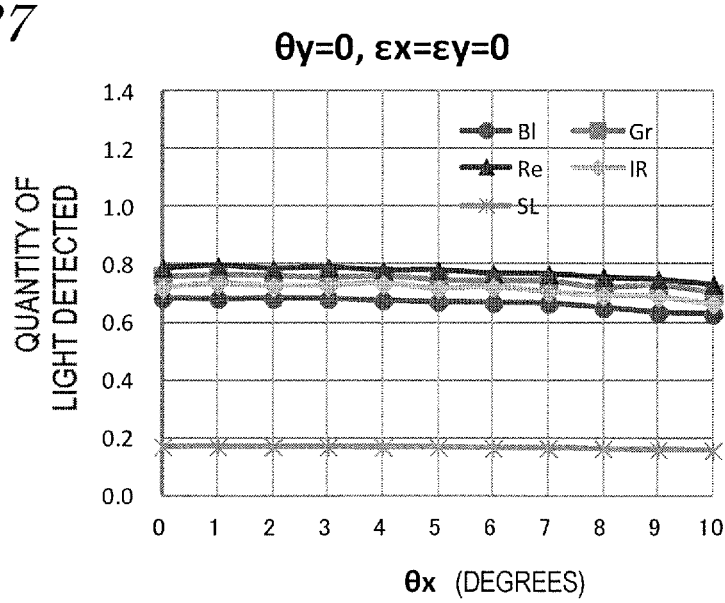
FIG. 27 is a graph showing the angle of incidence dependence of the solid-state image sensor of the comparative example.

FIGS. 24(a) and 24(b) illustrate cross-sectional structures of a solid-state image sensor as a comparative example. FIG. 25 is a plan view illustrating the arrangement of color filters in this comparative example. FIG. 24(a) is a cross-sectional view as viewed on the plane a-a shown in FIG. 25, and FIG. 24(b) is a cross-sectional view as viewed on the plane b-b shown in FIG. 25. FIG. 26 is a graph showing the light-splitting property of the solid-state image sensor of this comparative example. And FIG. 27 is a graph showing the angle of incidence dependence of the solid-state image sensor.

The configuration of this comparative example is obtained by removing the light-splitting element array 200 from the configuration of the embodiment shown in FIG. 7.

Comparing the results obtained in the embodiment (see FIGS. 20 and 23) to the ones obtained in the comparative example (see FIGS. 26 and 27), it can be seen that the quantity of infrared light received by the infrared light detector 5IR increased in the embodiment by a factor of 1.9 (when compared at a wavelength of 850 nm on the curve IR). The quantity of visible light received by the infrared light detector 5IR (when compared on the curve SL) increased by a factor of 1.1 (or by a factor of 0.6 when normalized by the quantity of infrared light received). The quantities of visible light received by the visible light detectors 5B, 5G and 5R (when compared on the curves Bl, Gr, Re and so on) increased by a factor of 0.9. Consequently, according to this embodiment, the infrared light detection sensitivity can be almost doubled.

Figure 28:
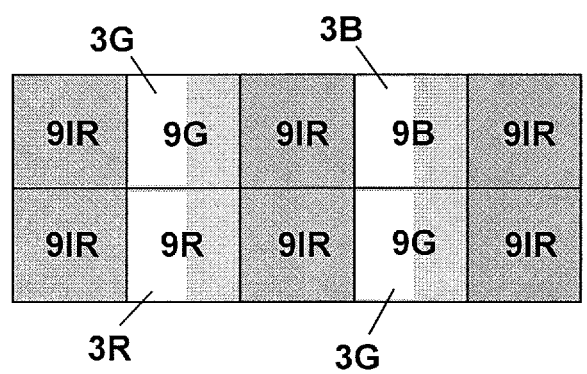
FIG. 28 shows layout of color filters, wherein (a) illustrates an arrangement of color filters in a solid-state image sensor according to an embodiment of the present disclosure and (b) illustrates an arrangement of color filters and an arrangement of phase filters in another embodiment.

Even though blue, green, red and infrared light beams are supposed to be detected in the example described above, the sensitivity to infrared light may also be increased when visible light (white light) and infrared light are detected. FIG. 28(a) illustrates an arrangement of color filters in such a situation. In this case, phase filters are arranged where there are white filters 9W. In that case, however, the phase filters have a single depth (e.g., may have the same depth as the phase filters 9G).

Figure 29:
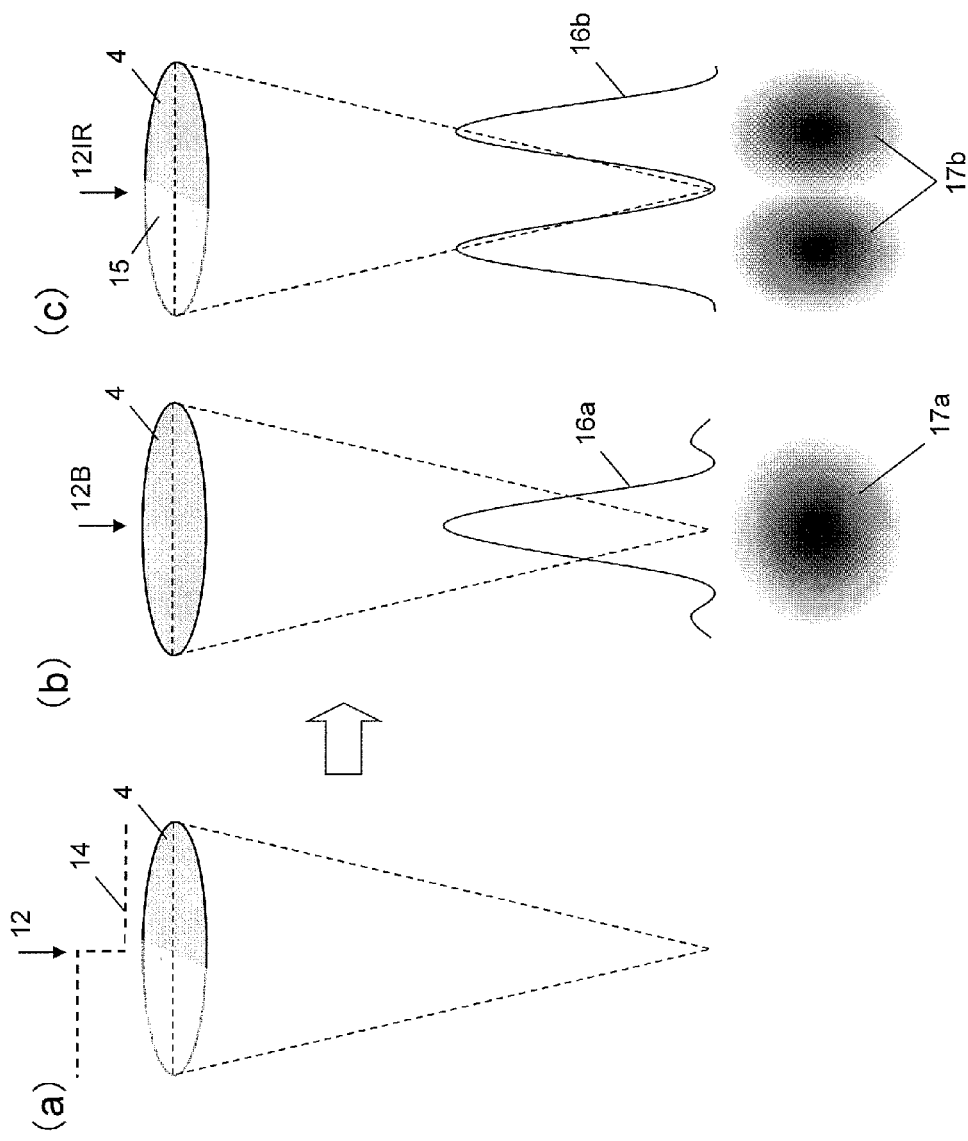
FIG. 29 shows how another exemplary light-condensing unit works according to the present disclosure, wherein (a) is a perspective view illustrating a configuration in which a phase filter is arranged so as to cover a half of a micro lens 4, of which the aperture has a circular planar shape. (b) is a perspective view illustrating how when a light beam 12B with the color blue wavelength is incident, a single condensed beam spot 16a (with an in-plane distribution 17a) is formed. And (c) is a perspective view illustrating how when a light beam 12IR with the infrared wavelength is incident, multiple split condensed beam spots 16b (with an in-plane distribution 17b) are formed.

Optionally, the phase filter 3 shown in FIG. 4 may be replaced with the phase filter shown in FIG. 29. Portion (a) of FIG. 29 is a perspective view illustrating a configuration in which a phase filter 14 is arranged in front of a micro lens 4 with a circular aperture. This phase filter 14 is configured so that its height creates a phase difference of 2π with respect to light with the color blue wavelength and creates a phase difference of π with respect to light with the infrared wavelength. As can be seen from portion (b) of FIG. 29, when a light beam 12B with the color blue wavelength is incident, a single condensed beam spot 16a (with an in-plane distribution 17a) is formed. On the other hand, as can be seen from portion (c) of FIG. 29, when a light beam 121R with the infrared wavelength is incident, two split condensed beam spots 16b (with an in-plane distribution 17b) are formed on the focal plane because there is a phase lag in the area 15 to create a phase difference of π.

If a phase filter such as the one shown in FIG. 29 is used, infrared light can be split into two light beams to be received by two detectors on the right- and left-hand sides. FIG. 28(b) is a plan view illustrating arrangements of color filters and phase filters which are superposed one upon the other in such a situation. In this case, phase filters 3B, 3G and 3R are arranged to face the color filters 9B, 9G and 9R and cover them by half. In the example illustrated in FIG. 28(b), the infrared filters are arranged in stripes. More specifically, when the phase filters 3R, 3G and 3B of each light-splitting element are viewed along a normal to the image capturing plane, the phase filters 3R, 3G and 3B are offset horizontally with respect to the respective centers of the color filters 9R, 9G and 9B and cover a half of the pixel region. As a result, this light-splitting element can make a light beam falling within a first wavelength range (which is visible light in this example) incident on the visible light detectors 5R, 5G and 5B that face the light-splitting element and can make a light beam falling within a second wavelength range (which is infrared light in this example) incident on the infrared light detector 5IR that is adjacent to the visible light detectors 5R, 5G and 5B.

The infrared filters do not have to be arranged in stripes but may also be arranged in a checkerboard pattern, a regular pattern such as an equilateral triangular or regular hexagonal pattern, or a combination of portions with these patterns.

In an embodiment of the present disclosure, the micro lenses 4 do not have to be arranged under the phase filters 3B, 3G and 3R but may be arranged over the phase filters or may even be omitted altogether. Also, although infrared light is split into light beams to be received by four detectors which are adjacent to each other in the surrounding four directions to increase the sensitivity of the surrounding infrared light detectors to infrared light, the wavelength does not have to fall within the infrared range.

An embodiment of an image capture device according to the present disclosure includes the solid-state image sensor described above, a signal processing section which processes an electrical signal supplied from the solid-state image sensor, and an optical system which produces an image on the image capturing plane of the solid-state image sensor. As the signal processing section and optical system, any arbitrary signal processing section and optical system for use in known image capture devices may be adopted.

Embodiments of the present disclosure can be used in an image capture device which captures a visible light image and an infrared light image.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A solid-state image sensor comprising:
   a photodetector array in which a plurality of photodetectors of a first type and a plurality of photodetectors of a second type are arranged two-dimensionally within an image capturing plane so that some of those photodetectors of the second type which are located in multiple different mutually intersecting directions with respect to each said photodetector of the first type are adjacent to the photodetector of the first type;
   a light-splitting element array in which a plurality of light-splitting elements, each including a phase filter, are arranged two-dimensionally and which is configured so that each of the plurality of light-splitting elements faces an associated one of the photodetectors of the first type; and
   a color filter array in which color filters with multiple different transmission properties are arranged, wherein;
      the phase filter of each said light-splitting element is configured to make light falling within a first wavelength range incident on the first type of photodetector that the phase filter faces and make light falling within a second wavelength range incident on the second type of photodetectors that are adjacent to the first type of photodetector,
      the phase filter is configured to create a phase difference of 290 with respect to a wavelength of the light to be incident on the first type of photodetectors,
      each said photodetectors of the first type is covered with a color filter which allows visible light to be transmitted, and
      each said photodetector of the second type is covered with a color filter which either reduces transmission of visible light or cuts the visible light.

2. The solid-state image sensor of claim 1, wherein each said lightsplitting element includes a micro lens.

3. The solid-state image sensor of claim 1, wherein the light falling within the first wavelength range is visible light and the light falling within the second wavelength range is infrared light.

4. The solid-state image sensor of claim 3, wherein the photodetector array is arranged at a distance of at least 5 µm from the phase filter.

5. The solid-state image sensor of claim 4, wherein the light falling within the second wavelength range has been split from the light falling within the first wavelength range due to interference at the distance of at least 5 µ m from the phase filter of each said light-splitting element.

6. The solid-state image sensor of claim 1, wherein the first and second types of photodetectors are alternately arranged in columns and rows within the image capturing plane.

7. The solid-state image sensor of claim 1, wherein the first and second types of photodetectors are arranged so as to form a checkerboard pattern within the image capturing plane, and
   each of the plurality of light-splitting elements makes the light falling within the second wavelength range incident on four of the photodetectors of the second type which are adjacent to the first type of photodetector that the light-splitting element faces.

8. The solid-state image sensor of claim 7, wherein each said lightsplitting element includes a micro lens, and
   the micro lens has a quadrilateral lens aperture and the phase filter is a columnar structure.

9. The solid-state image sensor of claim 8, wherein when viewed along a normal to the image capturing plane, the center of the micro lens agrees with the center of the phase filter.

10. An image capture device comprising:
    the solid-state image sensor of claim 1;
    a signal processing section which processes an electrical signal supplied from the solid-state image sensor; and
    an optical system which produces an image on the image capturing plane of the solid-state image sensor.

11. A solid-state image sensor comprising:
    a photodetector array in which a plurality of photodetectors of a first type and a plurality of photodetectors of a second type are alternately arranged in a first direction within an image capturing plane;
    a light-splitting element array in which a plurality of light-splitting elements, each including a phase filter, are arranged two-dimensionally and which is configured so that the plurality of light-splitting elements face the plurality of photodetectors of the first type; and
    a color filter array in which color filters with multiple different transmission properties are arranged wherein:
       the phase filter of each said light-splitting element is offset in a second direction that intersects with the first direction at right angles with respect to the first type of photodetector that the phase filter faces when viewed along a normal to the image capturing plane and is configured to make light falling within a first wavelength range incident on the first type of photodetector that the phase filter faces and make light falling within a second wavelength range incident on the two photodetectors of the second type that are adjacent to the first type of photodetector,
       each said photodetector of the first type is covered with a color filter which allows visible light to be transmitted, and
       each said photodetector of the second type is covered with a color filter which either reduces transmission of visible light or cuts visible light.

12. The solid-state image sensor of claim 11, wherein the first and second types of photodetectors are arranged so as to form a striped pattern within the image capturing plane, and
    each of the plurality of light-splitting elements makes the light falling within the second wavelength range incident on two of the photodetectors of the second type which are adjacent to the first type of photodetector that the light-splitting element faces.

13. The solid-state image sensor of claim 12, wherein each said light-splitting element includes a micro lens, and the phase filter is configured so that its phase level difference is aligned with the center axis of the micro lens when viewed along a normal to the image capturing plane.

* * * * *